(12) United States Patent
Sakai et al.

(10) Patent No.: US 8,049,255 B2
(45) Date of Patent: Nov. 1, 2011

(54) DISPLAY DEVICE AND METHOD OF MANUFACTURING THE SAME

(75) Inventors: Takeshi Sakai, Kokubunji (JP); Toshio Miyazawa, Chiba (JP); Takuo Kaitoh, Mobara (JP); Hidekazu Miyake, Mobara (JP)

(73) Assignee: Hitachi Displays, Ltd., Chiba-ken (JP)

( * ) Notice: Subject to any disclaimer, the term of this patent is extended or adjusted under 35 U.S.C. 154(b) by 235 days.

(21) Appl. No.: 12/155,504

(22) Filed: Jun. 5, 2008

(65) Prior Publication Data

US 2008/0303030 A1    Dec. 11, 2008

(30) Foreign Application Priority Data

Jun. 5, 2007  (JP) ................................ 2007-149249

(51) Int. Cl.
*H01L 31/062* (2006.01)
(52) U.S. Cl. ........ 257/291; 438/149; 257/223; 257/343; 257/493; 257/655; 257/E23.112; 257/E23.016; 257/E27.125; 257/E29.117
(58) Field of Classification Search .................. 257/223, 257/227, 291, 292, 439, 443, 655, E27.1, 257/E27.112, E29.117, E23.016, E27.125, 257/217, 382, 343, 624; 438/149
See application file for complete search history.

(56) References Cited

U.S. PATENT DOCUMENTS

| | | | |
|---|---|---|---|
| 5,286,659 A * | 2/1994 | Mitani et al. ..................... | 438/30 |
| 5,355,002 A | 10/1994 | Wu | |
| 5,474,941 A * | 12/1995 | Mitani et al. ................... | 438/151 |
| 5,917,199 A | 6/1999 | Byun et al. | |
| 5,989,944 A * | 11/1999 | Yoon .............................. | 438/149 |
| 6,160,268 A | 12/2000 | Yamazaki | |
| 6,451,632 B1 * | 9/2002 | Sung .............................. | 438/149 |
| 6,788,376 B2 * | 9/2004 | Izumi et al. .................... | 349/139 |

(Continued)

FOREIGN PATENT DOCUMENTS

KR    10-0671824    1/2007

OTHER PUBLICATIONS

T. Tanaka, et al., "An LCD Addressed by a-Si:H TFTs with Peripheral poly-Si TFT Circuits", Hitachi Research Laboratory, IEEE, 1993, pp. IEDM 93-389-392.

(Continued)

*Primary Examiner* — Matthew Smith
*Assistant Examiner* — Su Kim
(74) *Attorney, Agent, or Firm* — Stites & Harbison PLLC; Juan Carlos A. Marquez, Esq.

(57) ABSTRACT

A semiconductor device includes an insulating substrate and a TFT element disposed on the substrate. The TFT element includes a gate electrode, a gate insulating film, a semiconductor layer, and a source electrode and a drain electrode arranged in that order on the insulating substrate. The semiconductor layer includes an active layer composed of polycrystalline semiconductor and a contact layer segment interposed between the active layer and the source electrode and another contact layer segment interposed between the active layer and the drain electrode. The source and drain electrodes each have a first face facing the opposite face of the active layer from the interface with the gate insulating layer and a second face facing an etched side face of the active layer. Each contact layer segment is disposed between the active layer and each of the first and second faces of the source or drain electrode.

9 Claims, 19 Drawing Sheets

U.S. PATENT DOCUMENTS

| | | |
|---|---|---|
| 2002/0004291 A1 | 1/2002 | Yamazaki |
| 2005/0070055 A1 | 3/2005 | Kunii |
| 2007/0034879 A1* | 2/2007 | Park et al. ................. 257/72 |
| 2007/0065991 A1* | 3/2007 | Kim et al. ................. 438/149 |
| 2007/0134856 A1 | 6/2007 | Jang et al. |
| 2008/0061295 A1* | 3/2008 | Wang et al. ................. 257/59 |
| 2008/0206923 A1* | 8/2008 | Kim et al. ................. 438/104 |

OTHER PUBLICATIONS

M. Yuki, et al, "A Full Color LCD Addressed by Poly Si TFTS Fabricated at Low Temperature Below 450° C.", 1988 International Display Research Conference, IEEE, 1988, pp. 220-221.

Extended European Search Report for Application No. 08010269.2-1528/2001046, dated Dec. 8, 2010.

* cited by examiner

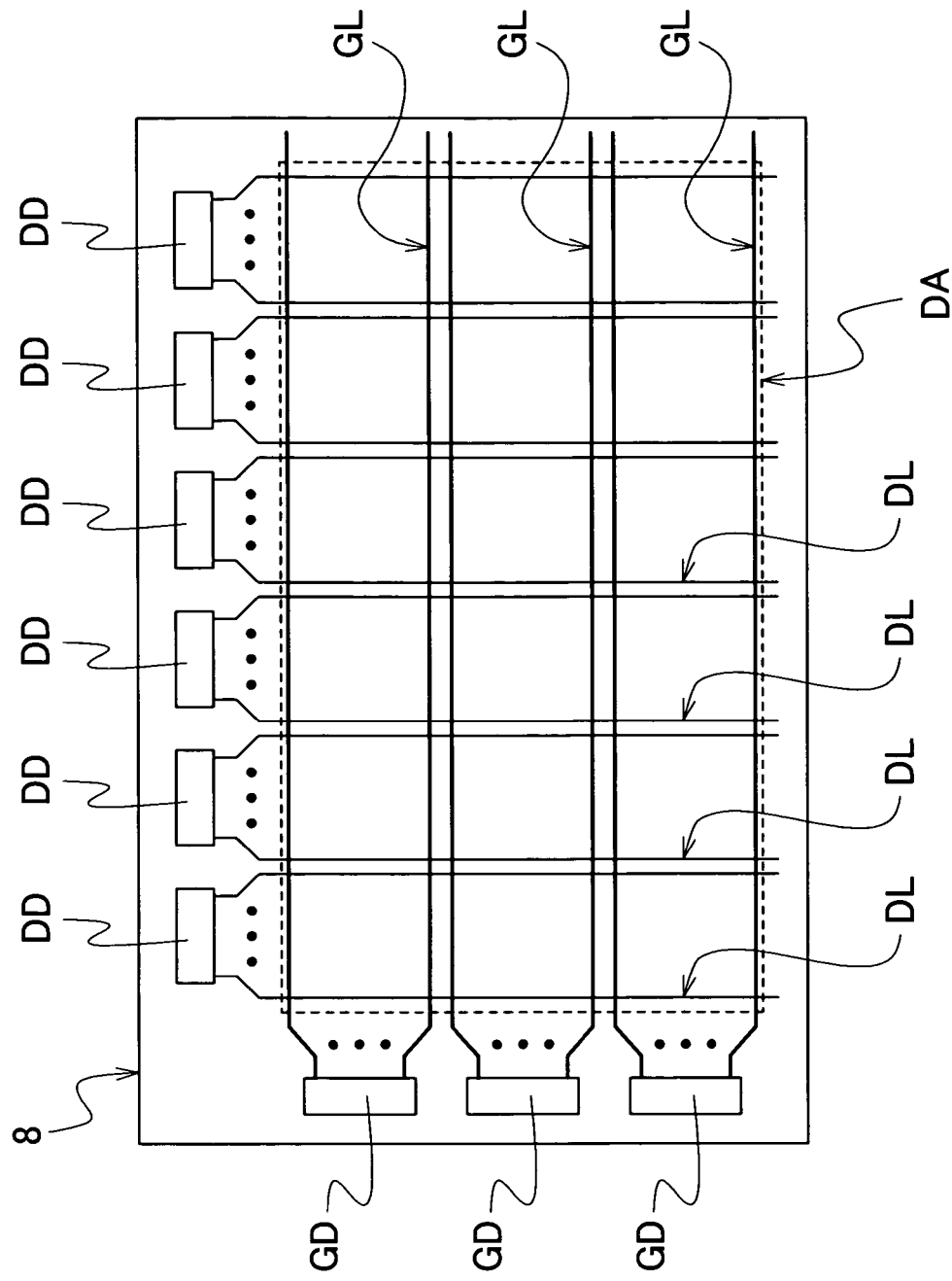

DISPLAY DEVICE AND METHOD OF MANUFACTURING THE SAME

BACKGROUND OF THE INVENTION

1. Field of the Invention

The present invention relates to a semiconductor device and a method of manufacturing the same and, more particularly, to a technique that is effective in application to a thin film transistor (TFT) liquid crystal display panel having a driver circuit therein and a method of manufacturing the same.

2. Background Art

Heretofore, TFT elements have been widely used in IC chips, such as a central processing unit (CPU) and a memory, and in semiconductor devices, such as a liquid crystal display panel.

The TFT elements each have a laminated structure including an insulating substrate having a first surface, on which a gate electrode, a gate insulating film, a semiconductor layer (semiconductor film), and a source electrode and a drain electrode are arranged. The TFT elements are broadly divided into a top-gate type and a bottom-gate type according to the order of lamination of those layers. The top-gate TFT element includes, in series, the insulating substrate, the semiconductor layer, the gate insulating film, and the gate electrode. The bottom-gate TFT element includes, in series, the insulating substrate, the gate electrode, the gate insulating film, and the semiconductor layer.

A liquid crystal display panel, one of semiconductor devices, includes a first substrate, a second substrate, and a liquid crystal material disposed between the first and second substrates. One of the first and second substrates is made of, for example, glass. The glass substrate, serving as an insulating substrate with a first surface, has on the first surface a plurality of scanning signal lines, a plurality of video signal lines, a plurality of TFT elements arranged in a matrix, and pixel electrodes arranged in a matrix.

The liquid crystal display panel having the TFT elements further includes a driver circuit for generating scanning signals to be supplied to the scanning signal lines and a driver circuit for generating video signals to be supplied to the video signal lines. Each driver circuit is constructed as, for example, a driver IC in chip form. A semiconductor package, such as a chip on film (COF) package or a tape carrier package (TCP), provided with the driver IC is typically connected to a substrate (hereinafter, a TFT substrate) having the scanning signal lines thereon.

However, some of recent liquid crystal display panels have a structure in which the above-described driver circuits are arranged outside a display area in the TFT substrate (insulating substrate) in addition to the scanning signal lines. In other words, the liquid crystal display panel (TFT substrate) includes the driver circuits.

To form a bottom-gate TFT element in a semiconductor device, in many cases, amorphous semiconductor, e.g., amorphous silicon (a-Si) has been used for an active layer constituting a semiconductor layer. However, the use of polycrystalline semiconductor, e.g., polycrystalline silicon (poly-Si), as the active layer of the semiconductor layer has increased in recent semiconductor devices in order to achieve high-speed operation.

SUMMARY OF THE INVENTION

To form a bottom-gate TFT element on a first surface of an insulating substrate, a gate electrode and a gate insulating film are formed on the first surface of the insulating substrate. Subsequently, a first semiconductor layer and a second semiconductor layer are sequentially formed. The first semiconductor layer is allowed to function as an active layer and the second semiconductor layer is allowed to function as a contact layer (diffusion layer) for the first semiconductor layer. After that, the semiconductor layers are etched, thereby shaping the semiconductor layers into an island. Subsequently, a conductive film is formed over the semiconductor-layer island and is then etched, thus forming a source electrode and a drain electrode. After that, the second semiconductor layer on the first semiconductor layer (active layer) is etched using the source electrode and the drain electrode as masks, thereby forming a contact layer segment disposed between the source electrode and the active layer and a contact layer segment disposed between the drain electrode and the active layer.

In the bottom-gate TFT element formed in the above-described manner, when the active layer of the semiconductor layer is composed of polycrystalline semiconductor, this leads to a disadvantage, e.g., an increase in resistive leakage current flowing between the drain electrode and the source electrode when the TFT element is turned off.

It is an object of the invention to provide a technique of reducing resistive leakage current in a bottom-gate TFT element including polycrystalline semiconductor.

The above and other objects, features and advantages of the invention will be apparent from the following detailed description in conjunction with the accompanying drawings.

Representative aspects of the invention disclosed in the present application will be briefly described below.

According to a first aspect of the invention, a display device includes an insulating substrate having a first surface and a TFT element arranged on the first surface of the insulating substrate. The TFT element includes a gate electrode, a gate insulating film, a semiconductor layer, and a source electrode and a drain electrode. The semiconductor layer includes an active layer composed of polycrystalline semiconductor and a contact layer having a segment interposed between the active layer and the source electrode and another segment interposed between the active layer and the drain electrode. The source electrode and the drain electrode each have a first face that faces the opposite face of the active layer from the interface with the gate insulating film and a second face that faces an etched side face of the active layer. The contact layer is interposed between the active layer and the first face of each of the source electrode and the drain electrode and is interposed between the active layer and the second face of each of the source electrode and the drain electrode.

According to this aspect, an insulating layer different from the gate insulating film may be arranged between the active layer and the second face of each of the source electrode and the drain electrode.

According to a second aspect of the invention, a display device includes an insulating substrate. The insulating substrate has a first surface on which a gate electrode, a gate insulating film, a semiconductor layer, and a source electrode and a drain electrode are arranged in that order. The semiconductor layer includes an active layer composed of polycrystalline semiconductor and a contact layer having a segment disposed between the active layer and the source electrode and another segment disposed between the active layer and the drain electrode. The source electrode and the drain electrode each have a first face that faces the opposite face of the active layer from the interface with the gate insulating film and a second face that faces an etched side face of the active layer. The contact layer is interposed between the active layer and the first face of each of the source electrode and the drain electrode. An insulating layer different from the gate insulating layer is disposed in a region where the contact layer is not arranged between the active layer and each of the source electrode and the drain electrode.

In the device according to this aspect, the contact layer segments, the source electrode, and the drain electrode may have substantially the same projected plan shape on the first surface of the insulating substrate.

In this device, each of the source electrode and the drain electrode may be a laminate including at least two kinds of conductive layers having different compositions.

In this device, the insulating substrate may have a plurality of scanning signal lines, a plurality of video signal lines, and a plurality of pixels arranged in a matrix on the first surface such that a pixel is disposed in each region surrounded by two adjacent scanning signal lines and two adjacent video signal lines. The pixels arranged in a matrix may constitute a display area.

In this device, each pixel may have a switching element including a TFT element and a pixel electrode. The switching element connects the corresponding video signal line to the pixel electrode.

In this device, the insulating substrate may include a driver circuit having a TFT element, the driver circuit being disposed outside a display area. The driver circuit, scanning signal lines, video signal lines, switching elements, and pixel electrodes may be arranged on the first surface of the insulating substrate.

In this device, a switching element may include a TFT element that includes, in series, a gate electrode, a gate insulating film, a semiconductor layer, and a source electrode and a drain electrode. The active layer, included in the semiconductor layer, may be composed of amorphous semiconductor.

According to a third aspect of the invention, there is provided a method of manufacturing a display device including an insulating substrate having a first surface and a TFT element that includes a gate electrode, a gate insulating film, a semiconductor layer, and a source electrode and a drain electrode arranged in that order on the first surface of the insulating substrate. The method includes the successive steps of (a) forming the gate electrode, (b) forming the gate insulating film, (c) forming an active layer, composed of polycrystalline semiconductor, constituting the semiconductor layer, (d) forming a second semiconductor layer, the kind and concentration of an impurity contained in the second semiconductor layer being different from those in the active layer, (e) forming a conductive film, (f) etching the conductive film to form the source electrode and the drain electrode, and (g) etching the second semiconductor layer to form a contact layer segment disposed between the source electrode and the active layer and another contact layer segment disposed between the drain electrode and the active layer.

According to this aspect, the method may further include the steps of, after step (d), forming an insulating layer on the second semiconductor layer. In this case, part or the whole of the insulating film above the active layer is removed to form an opening and the conductive film is then formed.

According to this aspect, step (c) may include the substeps of forming an amorphous semiconductor layer, polycrystallizing part or the whole of the amorphous semiconductor layer, and etching the polycrystallized semiconductor layer to form the active layer.

In the device according to any of the first and second aspects of the invention, in the bottom-gate TFT element including polycrystalline semiconductor as the active layer constituting the semiconductor layer, resistive leakage current which flows through the TFT element when the TFT element is turned off can be reduced.

Furthermore, the method according to the third aspect of the invention enables easy manufacture of a semiconductor device having a bottom-gate TFT element which includes polycrystalline semiconductor as an active layer constituting a semiconductor layer and in which resistive leakage current flowing through the TFT element when the TFT element is turned off is small.

BRIEF DESCRIPTION OF THE DRAWINGS

FIG. 3B is a schematic cross-sectional view illustrating a flow of current when the gate of the TFT element of FIG. 3A is turned on;

FIG. 7C is a schematic plan view of a TFT substrate in FIG. 7A;

DETAILED DESCRIPTION OF THE EMBODIMENTS

Figure 1A:
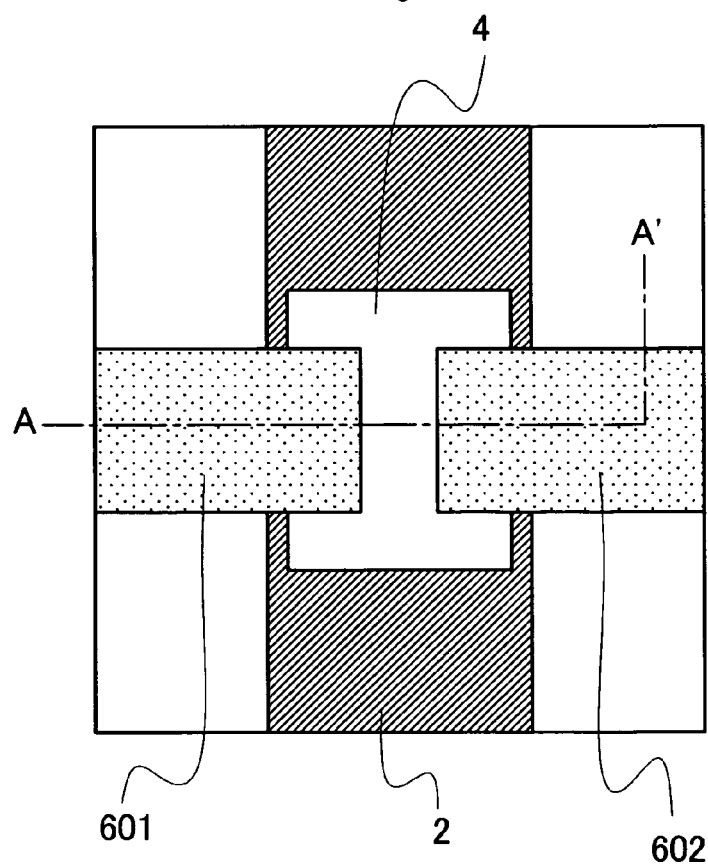
FIG. 1A is a schematic plan view of a TFT element according to a first embodiment of the invention.

An embodiment of the invention will now be described below in detail with reference to the drawings.

In the drawings for explanation of embodiments, components having the same function are designated by the same reference numeral, and the same explanation is not repeated.

First Embodiment

Figure 1B:
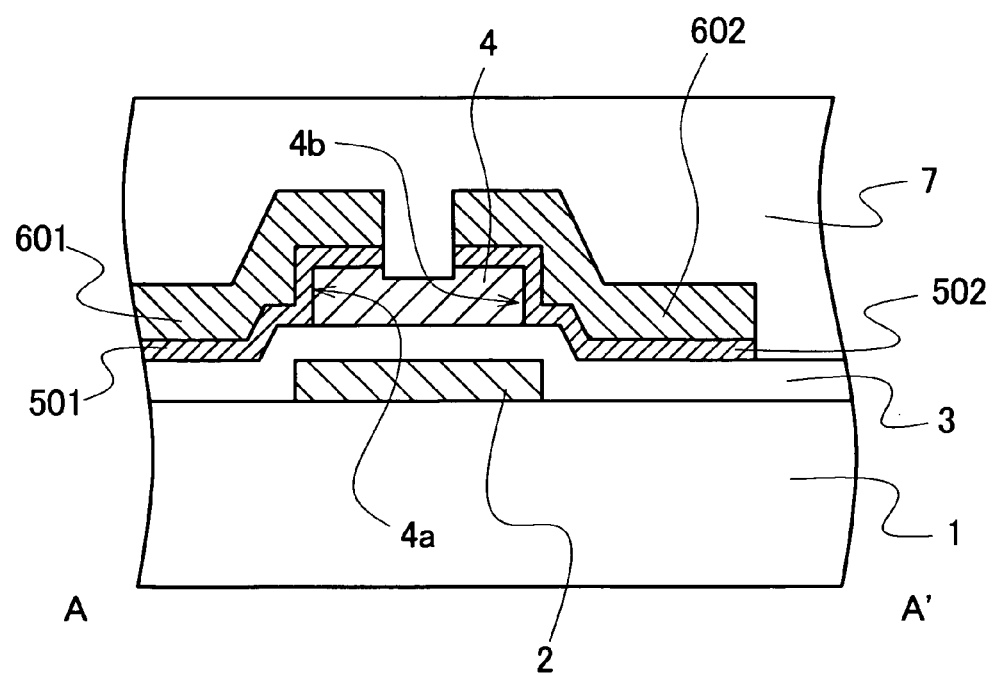
FIG. 1B is a cross-sectional view taken along the line A-A' of FIG. 1A.

FIG. 1A is a schematic plan view of a TFT element according to a first embodiment of the invention. FIG. 1B is a cross-sectional view taken along the line A-A' of FIG. 1A.

Referring to FIGS. 1A and 1B, the TFT element includes an insulating substrate 1, a gate electrode 2, a first insulating layer (gate insulating film) 3, an active layer 4 having etched side faces 4a and 4b, contact layer segments 501 and 502, a source electrode 601, a drain electrode 602, and a second insulating layer 7.

The TFT element according to the first embodiment is of the bottom-gate type. As shown in FIGS. 1A and 1B, the TFT element according to the first embodiment has a structure in which a first surface of the insulating substrate 1 is overlaid with the gate electrode 2, the first insulating layer 3 functioning as a gate insulating film, the active layer 4, the contact layer segments 501 and 502, and the source electrode 601 and the drain electrode 602 in that order. The active layer 4 and the contact layer segments 501 and 502 are semiconductor layers constituting a semiconductor layer assembly. The second insulating layer 7 covers the respective components, such as the source electrode 601 and the drain electrode 602, on the insulating substrate 1.

The active layer 4, constituting the semiconductor layer assembly, has a channel region when the TFT element is turned on. The active layer 4 is composed of, for example, polycrystalline silicon (poly-Si). The contact layer segments 501 and 502 correspond to a source diffusion region and a drain diffusion region, respectively. The contact layer segments 501 and 502 are composed of, for example, amorphous silicon (a-Si).

Assuming that the TFT element is an n-channel metal oxide semiconductor (NMOS) transistor, the active layer 4 is composed of, for example, p type (p-type) semiconductor with low impurity concentration and the contact layer segments 501 and 502 are composed of, for example, n type (n+ type) semiconductor with high impurity concentration.

In the TFT element according to the first embodiment, the contact layer segments 501 and 502, the source electrode 601, and the drain electrode 602 are directly disposed on the active layer 4 and the first insulating layer 3. Accordingly, the source electrode 601 has a first face that faces the opposite face of the active layer 4 from the interface with the gate insulating film (the first insulating layer 3) and a second face that faces the etched side face 4a of the active layer 4. Similarly, the drain electrode 602 has a first face that face the opposite face of the active layer 4 from the interface with the gate insulating film (the first insulating layer 3) and a second face that faces the etched side face 4b of the active layer 4.

In the TFT element according to the first embodiment, the projected plan shapes of the contact layer segments 501 and 502 on the insulating substrate 1 are substantially the same as the projected plan shapes of the source electrode 601 and the drain electrode 602 on the insulating substrate 1, respectively. The contact layer segments 501 and 502, the source electrode 601, and the drain electrode 602 extend outwardly from the active layer 4.

In other words, in the TFT element according to the first embodiment, the contact layer segment 501 is interposed between the active layer 4 and each of the first and second faces of the source electrode 601. Similarly, the contact layer segment 502 is interposed between the active layer 4 and each of the first and second faces of the drain electrode 602.

Figure 2A:
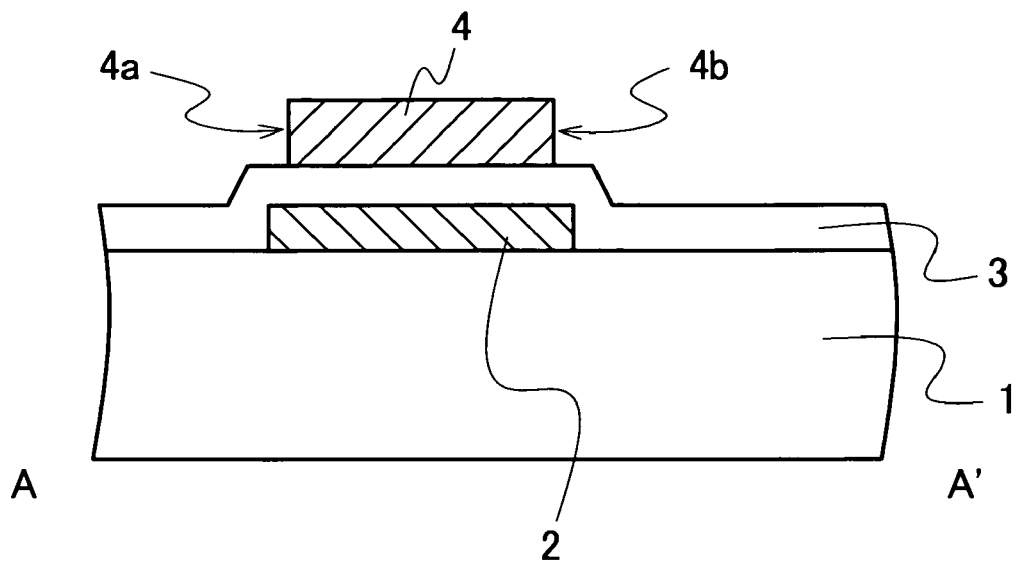
FIG. 2A is a schematic cross-sectional view illustrating a state just after an active layer is formed.
Figure 2B:
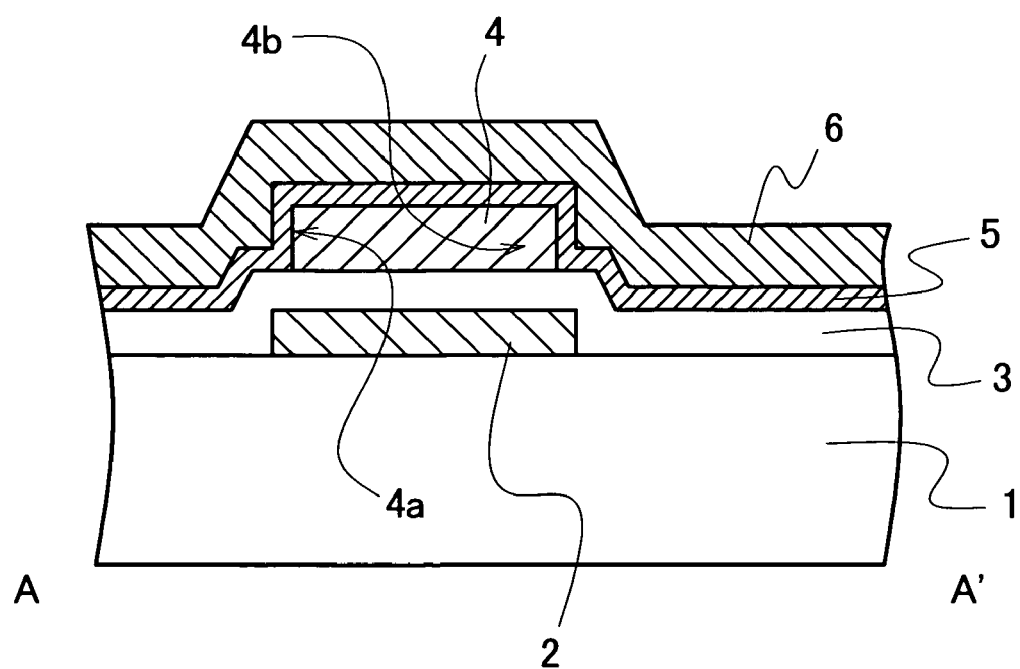
FIG. 2B is a schematic cross-sectional view illustrating a state just after a second semiconductor layer and a conductive film are formed.
Figure 2C:
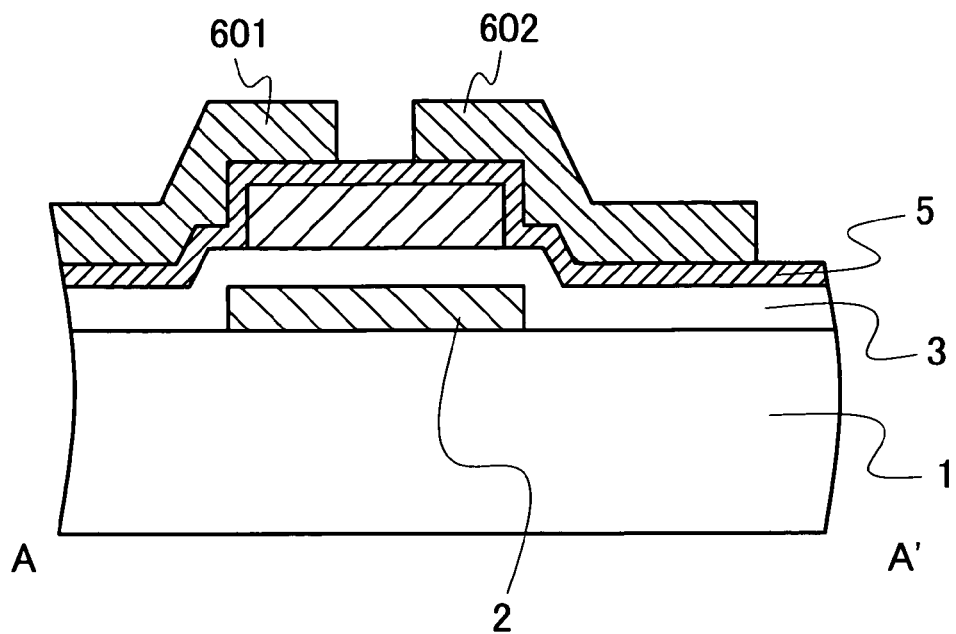
FIG. 2C is a schematic cross-sectional view illustrating a state just after the conductive film is etched.
Figure 2D:
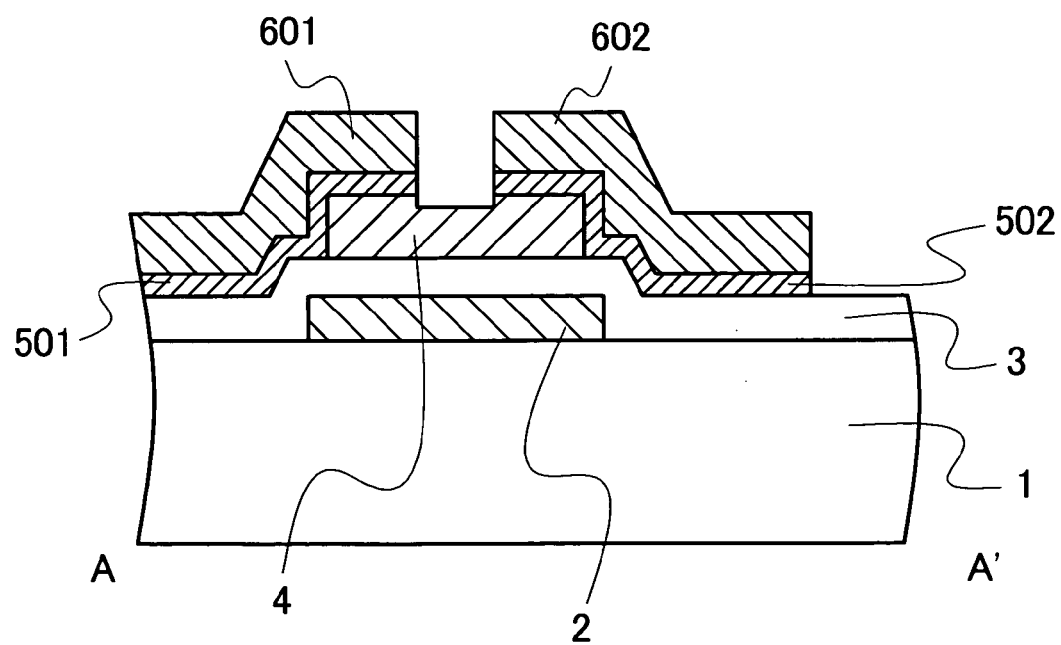
FIG. 2D is a schematic cross-sectional view illustrating a state just after the second semiconductor layer is etched.

FIGS. 2A to 2D are schematic cross-sectional views for explaining a method of manufacturing the TFT element according to the first embodiment. FIG. 2A is a schematic cross-sectional view illustrating a state just after the active layer is formed. FIG. 2B is a cross-sectional view illustrating a state just after a second semiconductor layer and a conductive film are formed. FIG. 2C is a schematic cross-sectional view showing a state just after the conductive film is etched. FIG. 2D is a schematic cross-sectional view showing a state just after the second semiconductor layer is etched. FIGS. 2A to 2D are cross-sectional views taken along the line A-A' of FIG. 1A.

To form the TFT element according to the first embodiment, for example, the gate electrode 2 is first formed on the first surface of the insulating substrate 1 and the first insulating layer 3, functioning as a gate insulating film, is then formed. A method of making the gate electrode 2 and a material (conductive film) used for the gate electrode 2 may be selected from methods and materials used in the manufacture of related-art TFT elements. Similarly, a method of making the first insulating layer 3 and a material (conductive film) used for the first insulating layer 3 may be selected from methods and materials used in the manufacture of the related-art TFT elements.

Subsequently, the active layer 4 having an island shape is formed on the first insulating layer 3 as shown in FIG. 2A. The active layer 4 is made such that, for example, the whole surface of the first insulating layer 3 is covered with an amorphous silicon film (first semiconductor film), part or the whole of the amorphous silicon film is polycrystallized, and after that, the first semiconductor film is etched. The etched side faces 4a and 4b described in this specification are formed when the active layer 4 is made in the above-described manner. Assuming that the TFT element is the NMOS transistor, to form the active layer 4 as a p type (p− type) layer, for example, part or the whole of the amorphous silicon film may be polycrystallized and, after that, an impurity may be doped into the polycrystallized silicon layer. Alternatively, a p type amorphous silicon film may be formed and be then polycrystallized.

Subsequently, as shown in FIG. 2B, the surface of the first insulating layer 3 having thereon the active layer 4 is overlaid with a second semiconductor layer 5 and a conductive film 6 in that order. Therefore, when the conductive layer 6 is formed, the etched side faces 4a and 4b of the active layer 4 are covered with the second semiconductor layer 5. The second semiconductor layer 5 is used for formation of the contact layer segments 501 and 502. Accordingly, when the TFT element is the NMOS transistor, for example, an n type (n+ type) amorphous silicon film with high impurity concentration is formed as the second semiconductor layer 5. The conductive film 6 is used for formation of the source electrode 601 and the drain electrode 602. In this instance, a method of making the second semiconductor film 5 and a material used for the second semiconductor layer 5 and a method of making the conductive film 6 and a material used for the conductive layer 6 may be selected from methods and materials used in the manufacture of the related-art TFT elements.

Subsequently, as shown in FIG. 2C, the conductive film 6 is etched, thus forming the source electrode 601 and the drain electrode 602.

After that, as shown in FIG. 2D, the second semiconductor layer 5 is etched, thus forming the contact layer segment 501 whose projected plan shape on the insulating substrate 1 is substantially the same as that of the source electrode 601 and the contact layer segment 502 whose projected shape on the insulating substrate 1 is substantially the same as that of the drain electrode 602. Finally, the second insulating layer 7 is formed, thereby obtaining the TFT element having a cross section as shown in FIG. 1B.

Figure 3A:
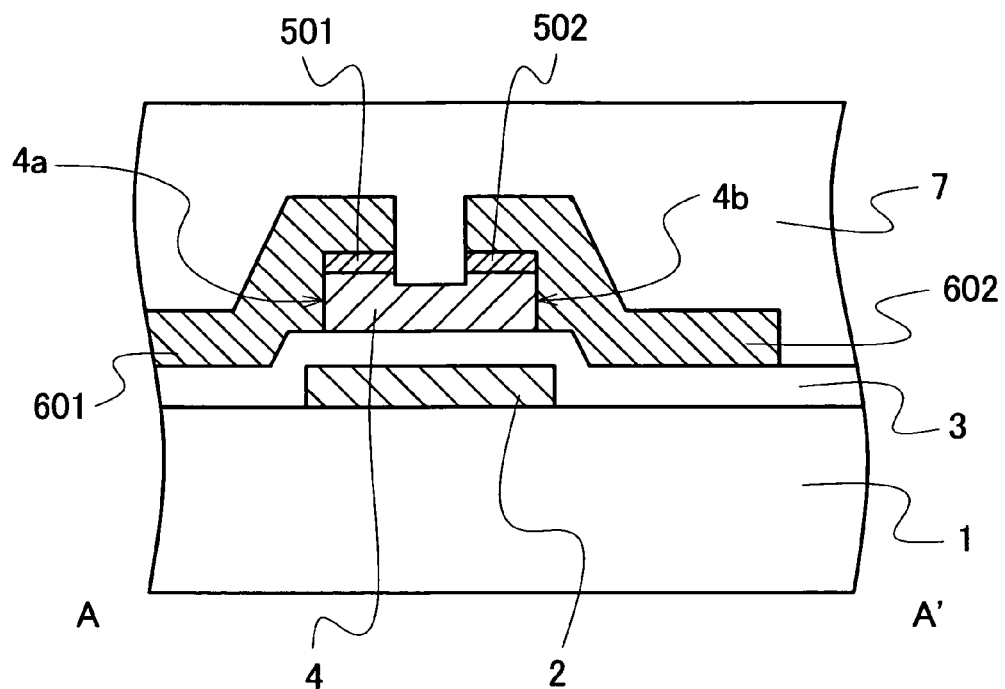
FIG. 3A is a schematic cross-sectional view of a related-art bottom-gate TFT element.
Figure 3B:
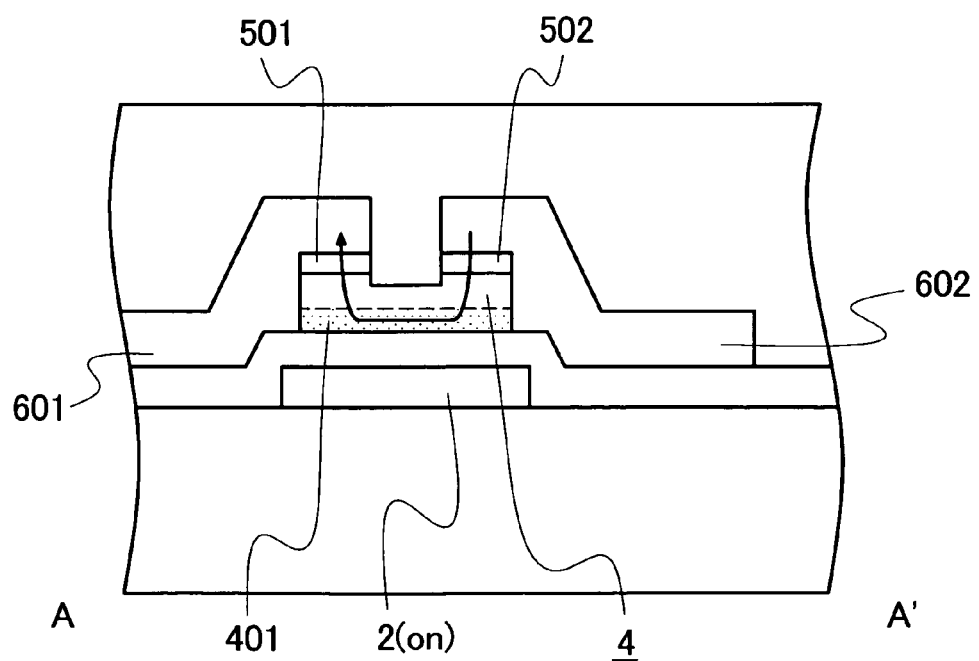
Figure 3C:
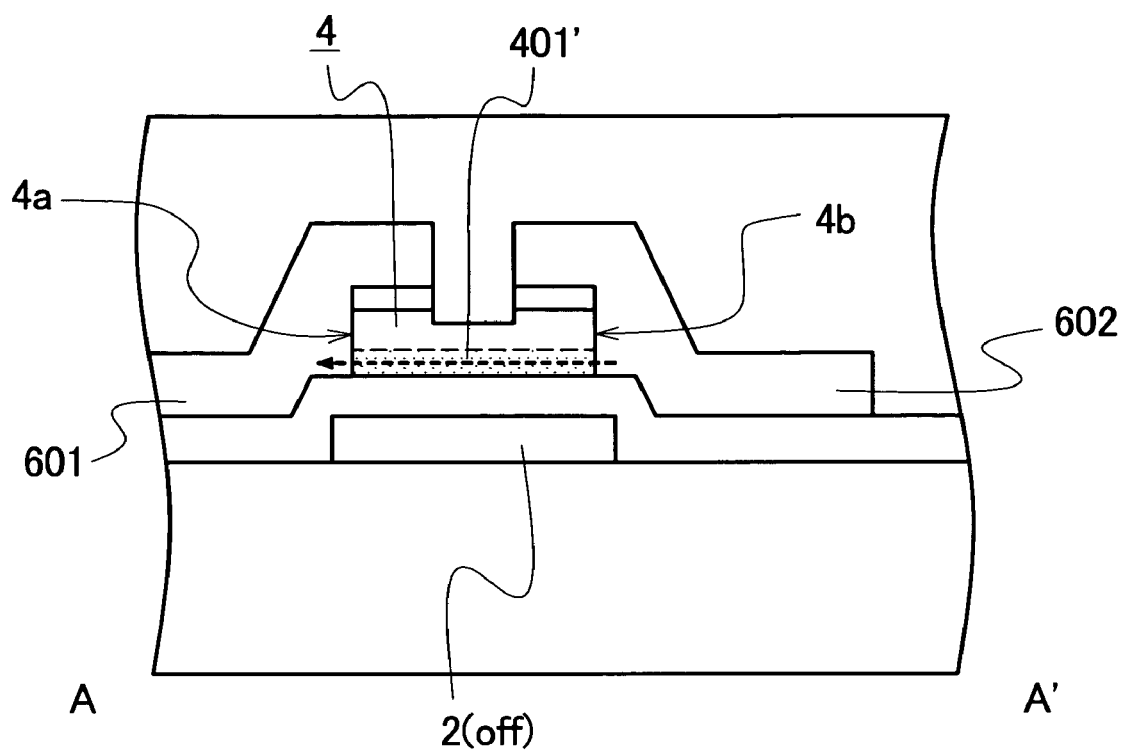
FIG. 3C is a schematic cross-sectional view illustrating a phenomenon that is caused when the gate of the TFT element of FIG. 3A is turned off.

FIGS. 3A to 3C are schematic cross-sectional views of a related-art bottom-gate TFT element and explain disadvantages of the related-art TFT element and advantages of the TFT element according to the first embodiment. FIG. 3A is a schematic cross-sectional view of the related-art bottom-gate TFT element. FIG. 3B is a schematic cross-sectional view illustrating a flow of current when the gate of the TFT element of FIG. 3A is turned on. FIG. 3C is a schematic cross-sectional view illustrating a phenomenon that is caused when the gate of the TFT element of FIG. 3A is turned off. FIGS. 3A to 3C are the cross-sectional views taken along the line A-A' of FIG. 1A assuming that the related-art TFT element has a structure shown in FIG. 1A.

The related-art bottom-gate TFT element has a cross sectional structure as shown in FIG. 3A. The first surface of the insulating substrate 1 is overlaid with the gate electrode 2, the first insulating layer (gate insulating film) 3, the active layer 4, the contact layer segments 501 and 502, and the source electrode 601 and the drain electrode 602 in that order. The active layer 4 and the contact layer segments 501 and 502 constitute a semiconductor layer assembly. This arrangement is the same as that of the TFT element according to the first embodiment.

According to a method of manufacturing the related-art TFT element, however, the first semiconductor layer and the second semiconductor layer 5 are formed and are then etched. After that, the conductive film 6 is formed to make the source electrode 601 and the drain electrode 602. Accordingly, when the conductive film 6 is formed, the etched side faces 4a and 4b of the active layer 4 are exposed. Consequently, the second face of the source electrode 601 is directly in contact with the etched side face 4a of the active layer 4 and the second face of the drain electrode 602 is directly in contact with the etched side face 4b of the active layer 4.

As for the TFT element having the cross sectional structure shown in FIG. 3A, when a signal potential applied to the gate electrode 2 becomes a high level, the TFT element is turned on, so that an inversion layer (channel region) is formed in the active layer 4 adjacent to the gate electrode 2. Accordingly, a channel region 401 is formed adjacent to the interface between the active layer 4 and the gate insulating film, as shown in FIG. 3B. Consequently, electrons flow from the source electrode 601 through the contact layer segment 501, the channel region 401, and the contact layer segment 502 to the drain electrode 602, so that current flows from the drain electrode 602 to the source electrode 601.

On the other hand, when a signal potential applied to the gate electrode 2 becomes a low level, the TFT element is turned off, so that the channel region 401 in the active layer 4 disappears. Therefore, there is no current flowing between the source electrode 601 and the drain electrode 602.

However, assuming that the active layer 4 is composed of a low-resistance semiconductor material, such as polycrystalline silicon, when a signal voltage applied to the gate electrode 2 is equal to a value at which the TFT element is turned off, disadvantageously, leakage current flows from the drain electrode 602 to the source electrode 601.

The inventors of the present application have studied the leakage current and found that, as shown in FIG. 3C, when the TFT element is turned off, holes are induced in the active layer 4 adjacent to the gate electrode 2 to form a pseudo channel region 401' and resistive leakage current flows through the holes in the pseudo channel region 401'.

In the related-art bottom-gate TFT element, a metal silicide film is formed on the interface between the etched side face 4a of the active layer 4 and the source electrode 601 and is also formed on the interface between the etched side face 4b and the drain electrode 602. The regions, in each of which the metal silicide film is arranged, serve as low-resistance contact regions different from the contact layer segments 501 and 502. Accordingly, even when a signal voltage applied to the gate electrode 2 is equal to a value at which the TFT element is turned off, resistive leakage current flows through holes induced in the pseudo channel region 401'. The inventors of this application have found the fact.

The inventors of this application further have found that the above-described flow of resistive leakage current can be prevented by arranging the contact layer segment 501 between the etched side face 4a of the active layer 4 and the second face of the source electrode 601 and disposing the contact layer segment 502 between the etched side face 4b of the active layer 4 and the second face of the drain electrode 602.

When the contact layer segment 501 is disposed between the etched side face 4a of the active layer 4 and the second face of the source electrode 601 and the contact layer segment 502 is disposed between the etched side face 4b of the active layer 4 and the second face of the drain electrode 602, there is no region (low-resistance contact region), where the metal silicide film is arranged, formed in the related-art TFT element. Therefore, even when the pseudo channel region 401' is formed upon turn off of the TFT element, the contact layer segments 501 and 502 respectively extending along the etched side faces 4a and 4b of the active layer 4 function as potential barriers, thus preventing resistive leakage current from flowing through the pseudo channel region 401'.

The TFT element according to the first embodiment can be made by the procedure described with reference to FIGS. 2A to 2D. In other words, although the position of a step of forming the active layer 4 and that of a step of forming the second semiconductor layer 5 in the method of manufacturing the TFT element according to the first embodiment differ from those in the method of manufacturing the related-art TFT element, the method of manufacturing the TFT element has the same number of steps as that of the method of manufacturing the related-art TFT element. Accordingly, the TFT element including polycrystalline semiconductor as the active layer 4 and capable of preventing resistive leakage current from flowing through the TFT element upon turn off can be easily manufactured.

To manufacture a semiconductor device including many TFT elements each including polycrystalline semiconductor as the active layer 4, therefore, the TFT elements with the structure described in the first embodiment are formed, so that resistive leakage current can be prevented from flowing through each TFT element when the TFT element is turned off. In addition, the manufacturing cost of the semiconductor device can be prevented from increasing.

Figure 4A:
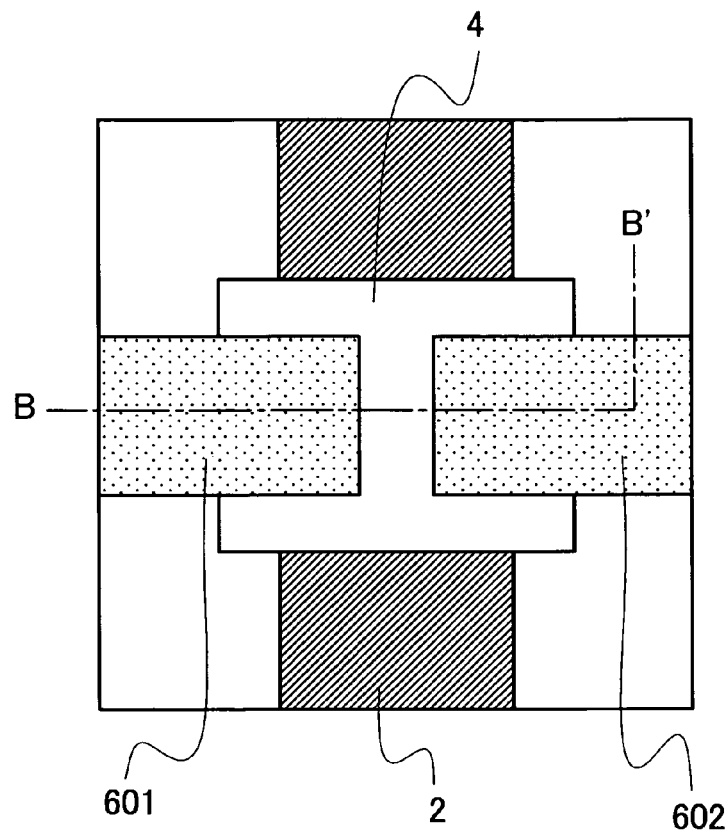
FIG. 4A is a schematic plan view of a TFT element according to a first modification of the first embodiment.
Figure 4B:
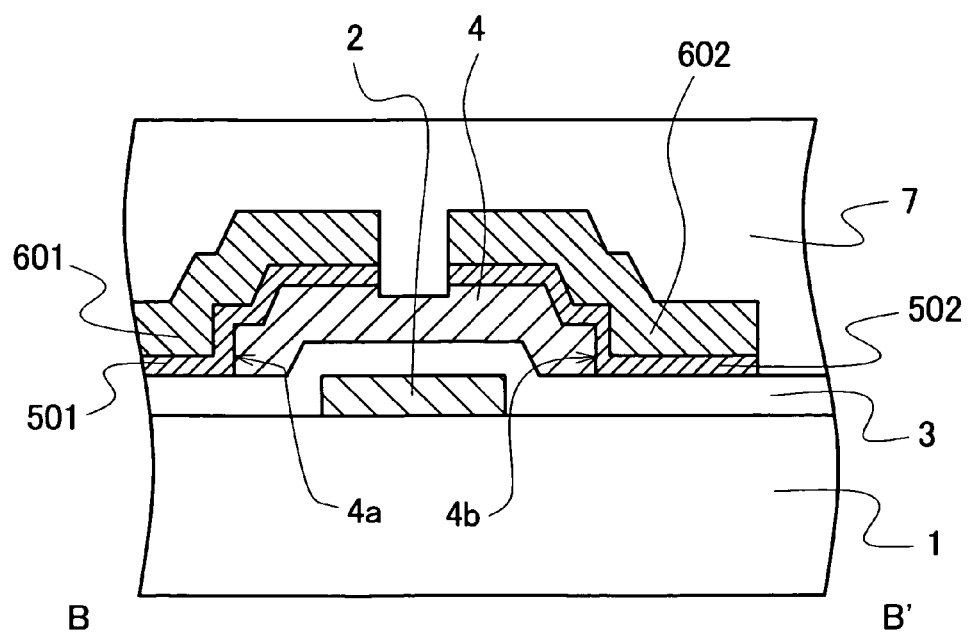
FIG. 4B is a cross-sectional view taken along the line B-B' of FIG. 4A.
Figure 5:
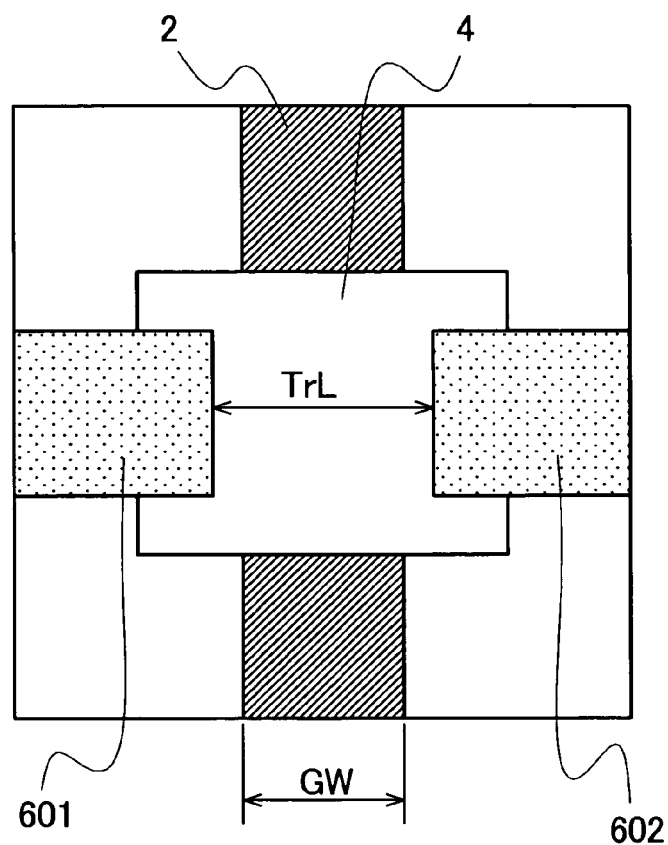
FIG. 5 is a schematic plan view of a TFT element according to a second modification of the first embodiment.

FIG. 4A is a schematic plan view of a TFT element according to a first modification of the first embodiment. FIG. 4B is a cross-sectional view taken along the line B-B' of FIG. 4A. FIG. 5 is a schematic plan view of a TFT element according to a second modification of the first embodiment.

For explanation of the features of the TFT element according to the first embodiment, FIGS. 1A and 1B illustrate the TFT element in which the whole of the active layer 4 is superimposed on the gate electrode 2.

The invention (first embodiment) is not limited to the structure shown in FIGS. 1A and 1B. The invention can be applied to a TFT element in which the active layer 4 is arranged so as to cross over the gate electrode 2, as shown in FIGS. 4A and 4B.

Referring to FIG. 4A showing the plan view of the TFT element, the source electrode 601 and the drain electrode 602 partially overlap the gate electrode 2.

The invention (first embodiment) is not limited to the structure shown in FIGS. 4A and 4B. The invention can be applied to a TFT element in which the channel length TrL is greater than the width GW of the gate electrode 2 and the source electrode 601 and the drain electrode 602 do not overlap the gate electrode 2, as shown in FIG. 5.

Furthermore, the invention (first embodiment) is not limited to the TFT elements having the planar structures shown in FIGS. 1A, 4A, and 5. The invention can be applied to a TFT element having any planar structure so long as the TFT element has a cross-sectional structure in which the source electrode 601 and the drain electrode 602 each have a face opposed to an etched side face of the active layer 4.

Figure 6:
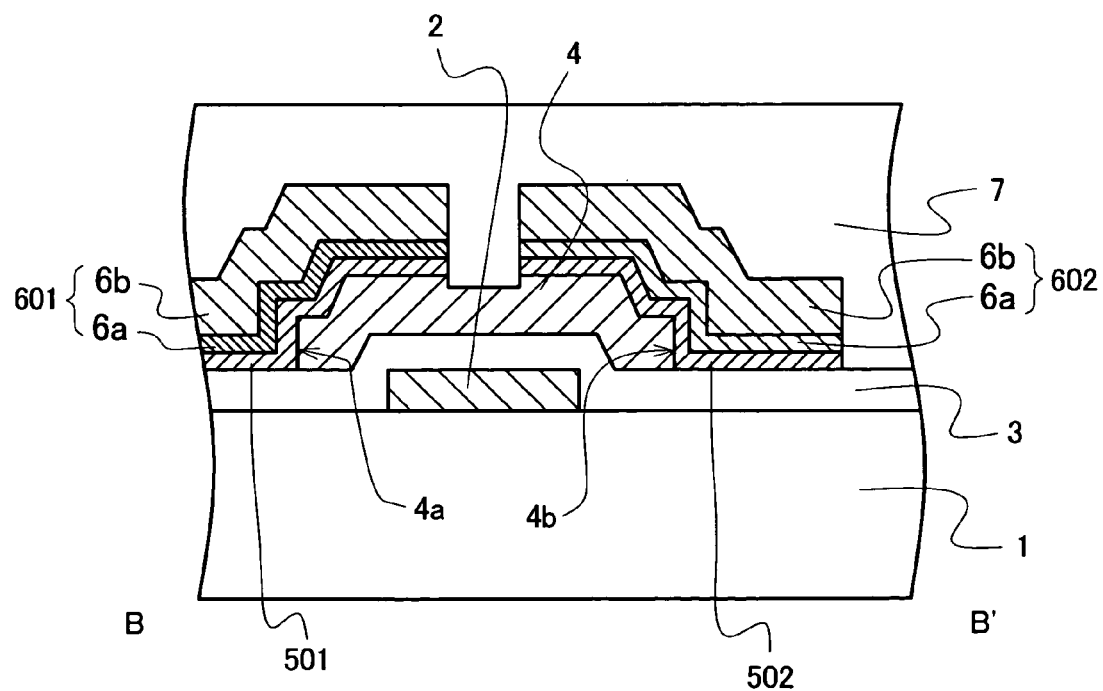
FIG. 6 is a schematic cross-sectional view of a TFT element according to a third modification of the first embodiment.

FIG. 6 is a schematic cross-sectional view of a TFT element according to a third modification of the first embodiment. The cross-sectional view of FIG. 6 corresponds to that taken along the line B-B' of FIG. 4A.

In the related-art TFT elements, in many cases, the conductive film 6, which is used for formation of the source electrode 601 and the drain electrode 602, includes a single conductive film, e.g., an aluminum film.

According to the invention (first embodiment), the conductive film 6 may include at least two kinds of conductive films having different compositions. In other words, in the TFT element according to the first embodiment, each of the source electrode 601 and the drain electrode 602 may be a laminate including a first conductive film 6a and a second conductive film 6b, as shown in FIG. 6. In this instance, assuming that the first conductive film 6a is a molybdenum tungsten (MoW) film and the second conductive film 6b is an aluminum film, the adhesion of the first conductive film 6a to the contact layer segments 501 and 502 is increased, thus reducing the possibility of separation of the source electrode 601 from the contact layer segment 501 and that of the drain electrode 602 from the contact layer segment 502.

FIG. 6 illustrates the two-layer structure including the two kinds of conductive films 6a and 6b having different compositions. The invention is not limited to the structure. The invention may be applied to a multilayer structure including three or more kinds of conductive films or a three-layer structure including two kinds of conductive films.

Figure 7A:
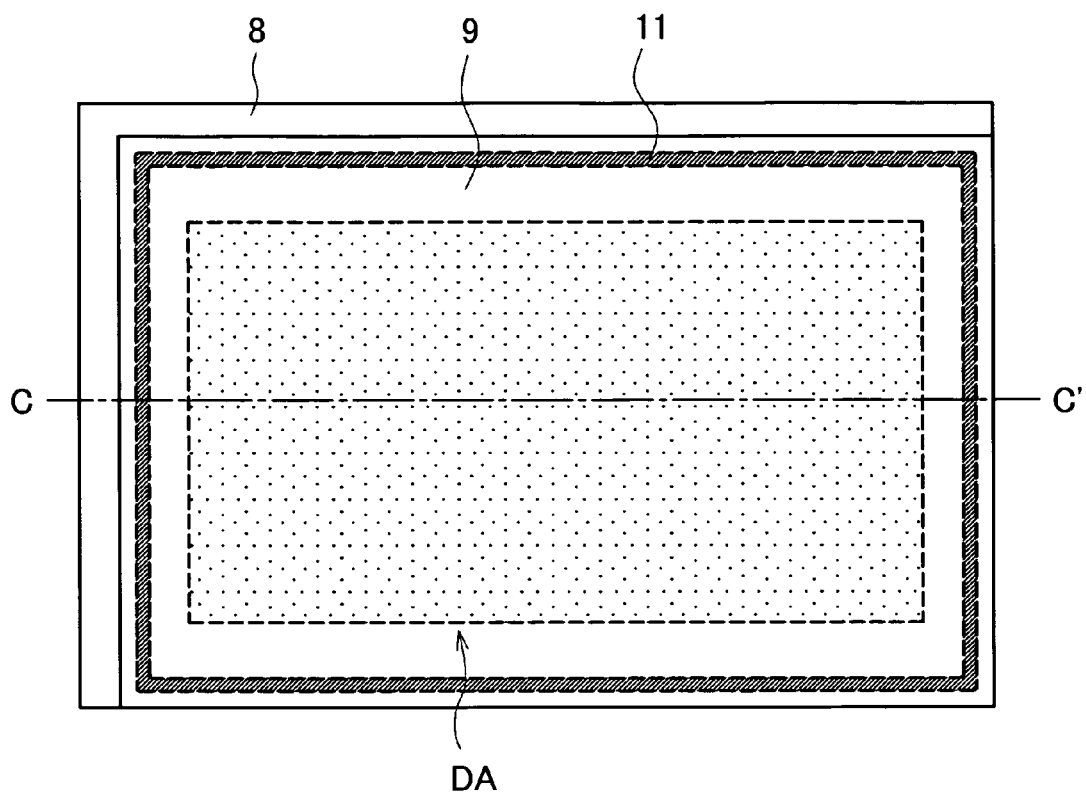
FIG. 7A is a schematic plan view of the structure of a liquid crystal display panel.
Figure 7B:
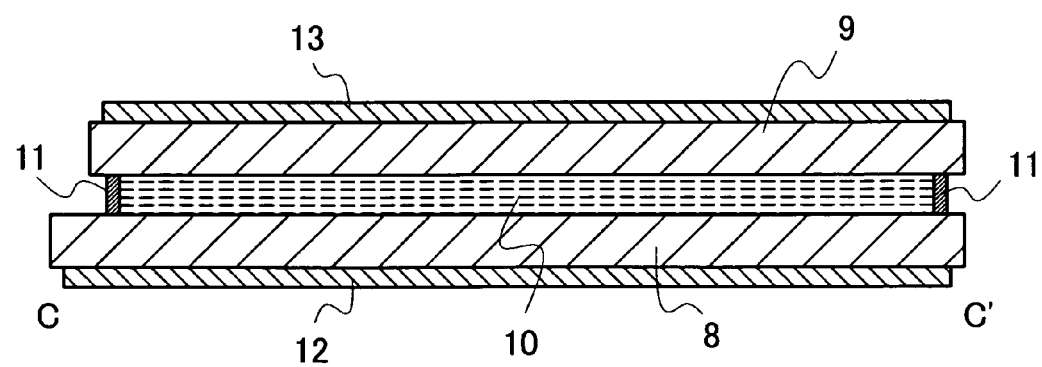
FIG. 7B is a cross-sectional view taken along the line C-C' of FIG. 7A.

FIGS. 7A to 7C are schematic diagrams illustrating the schematic structure of a semiconductor device (liquid crystal display panel) having the TFT elements according to the first embodiment. FIG. 7A is a schematic plan view of the liquid crystal display panel. FIG. 7B is a cross-sectional view taken along the line C-C' of FIG. 7A. FIG. 7C is a schematic plan view of a TFT substrate in FIG. 7A.

Referring to FIGS. 7A to 7C, the liquid crystal display panel includes a TFT substrate 8, an opposite substrate 9, a liquid crystal material 10, a seal 11, a lower polarizer 12, and an upper polarizer 13. The liquid crystal display panel has a display area DA. The liquid crystal display panel further includes scanning signal lines GL, video signal lines DL, first driver circuits GD, and second driver circuits DD.

The invention (first embodiment) is applicable to any semiconductor device irrespective of the use of the semiconductor device so long the semiconductor device includes TFT elements each having a bottom-gate structure as shown in, for example, FIG. 3A and including polycrystalline semiconductor as the active layer 4. In other words, the first embodiment can be applied not only to a TFT element integrated with an IC chip, such as a CPU or a semiconductor memory, but also to a TFT element arranged on a TFT substrate of a TFT liquid crystal display device (panel).

The TFT liquid crystal display panel has a structure in which the liquid crystal material 10 is enclosed between the TFT substrate 8 and the opposite substrate 9 as shown in, for example, FIGS. 7A and 7B. In this instance, the TFT substrate 8 is attached to the opposite substrate 9 with the seal 11 arranged on the outer surface of the display area DA circularly. The space defined by the TFT substrate 8, the opposite substrate 9, and the seal 11 is filled with the liquid crystal material 10.

When the TFT liquid crystal display panel is of a transmissive or transflective type, the lower polarizer 12 is arranged on the outer surface of the TFT substrate 8 and the upper polarizer 13 is arranged on the outer surface of the opposite substrate 9. A single-layer or multi-layer retardation film may be disposed between the TFT substrate 8 and the lower polarizer 12 and a similar retardation film may be disposed between the opposite substrate 9 and the upper polarizer 13. When the TFT liquid crystal display panel is of a reflective type, generally, the display panel does not require the lower polarizer 12.

The TFT substrate 8 has the scanning signal lines GL and the video signal lines DL, as shown in FIG. 7C. The scanning signal lines GL and the video signal lines DL are arranged with an insulating layer therebetween. The display area DA includes an array of pixels each including a TFT element, functioning as a switching element, and a pixel electrode connected to the source electrode and the drain electrode of the TFT element.

Some of recent liquid crystal display panels have a structure in which the first driver circuits GD and the second driver circuits DD are disposed outside the display area DA of the TFT substrate 8. The first driver circuits GD each function as an integrated circuit for controlling the turning on/off of a scanning signal to be supplied to the corresponding scanning signal line GL. The second driver circuits DD each function as an integrated circuit for generating a video signal to be supplied to the corresponding video signal line and controlling the timing of supply of the video signal.

In the related-art liquid crystal display panels, in many cases, ICs in chip form manufactured in a step different from a step of making a TFT substrate are used as the first driver circuits GD and the second driver circuits DD. The TFT substrate 8 shown in FIG. 7C includes therein the first driver circuits GD and the second driver circuits DD such that the first driver circuits GD and the second driver circuits DD are made together with the scanning signal lines GL, the video signal lines DL, and the switching elements (TFT elements).

The first driver circuits GD and the second driver circuits DD each include an integrated circuit having a TFT element, a resistor, and a capacitor. The TFT elements in the first driver circuits GD and the second driver circuits DD have to be operated at much higher speed than the TFT elements (switching elements) disposed in the display area. Therefore, when the TFT elements in the first driver circuits GD and the second driver circuits DD are constructed so as to have a bottom-gate structure, it is preferred that the active layer 4 be composed of polycrystalline silicon and each TFT element have a structure as shown in FIGS. 1A and 1B or FIGS. 4A and 4B.

Furthermore, when the TFT elements in the first driver circuits GD and the second driver circuits DD are each constructed as the bottom-gate TFT element described in the first embodiment, it is preferred that the TFT elements (switching elements) disposed in the display area DA be constructed as the same bottom-gate TFT element.

Figure 8A:
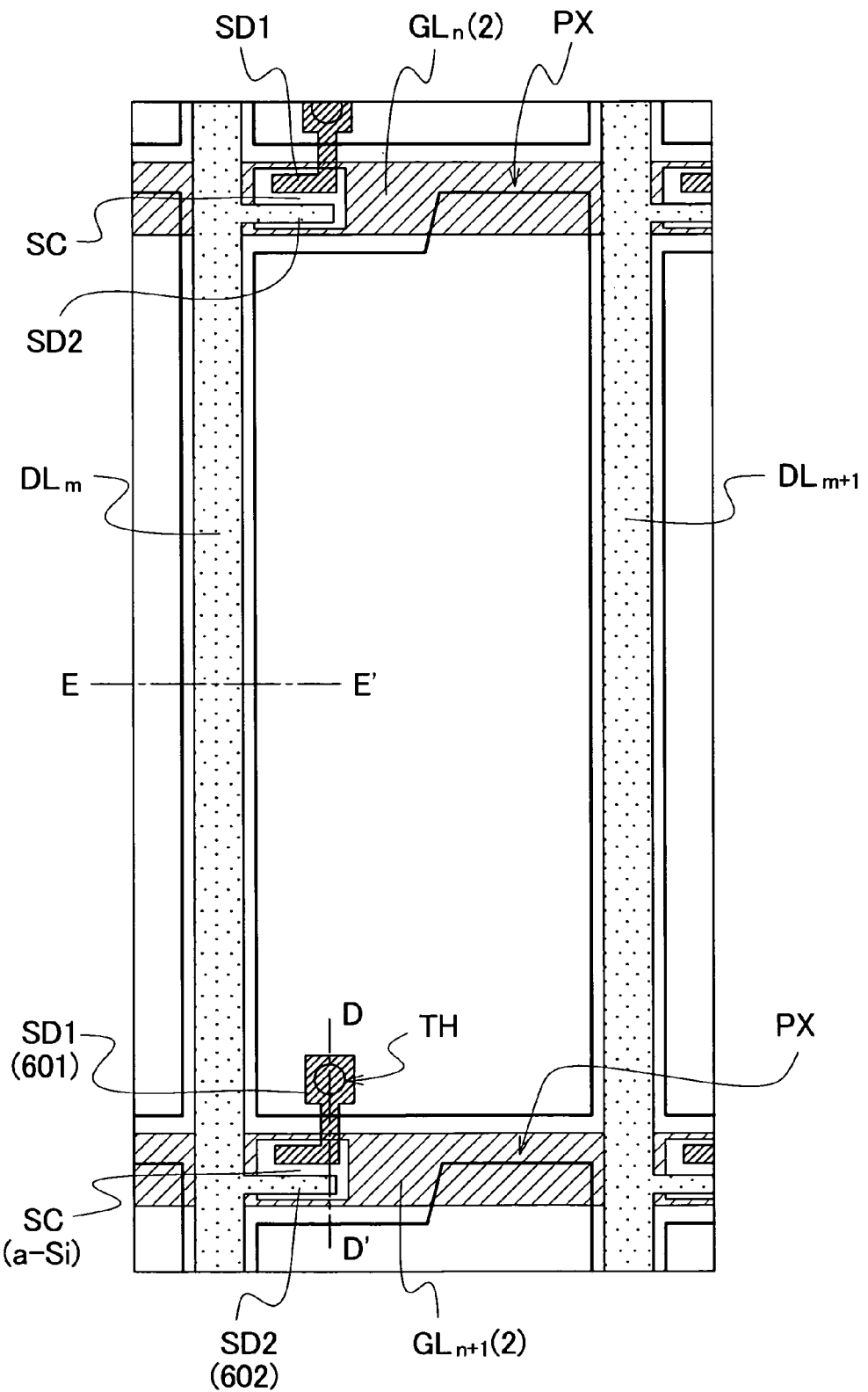
FIG. 8A is a schematic plan view of one pixel in a display area in the TFT substrate.
Figure 8B:
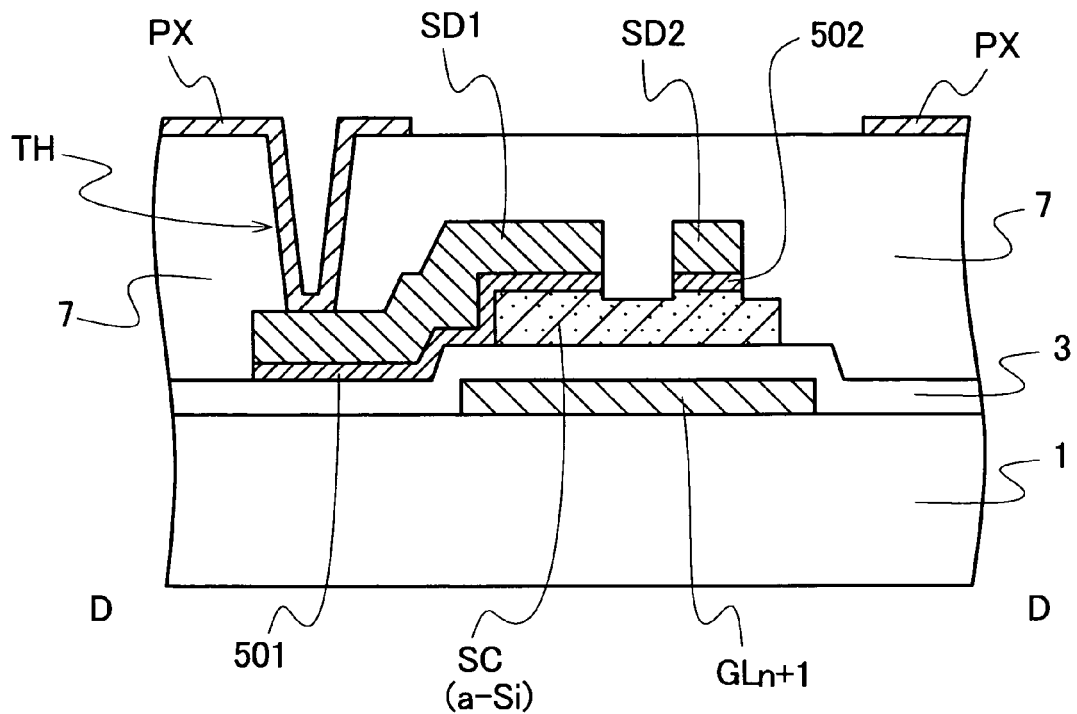
FIG. 8B is a cross-sectional view taken along the line D-D' of FIG. 8A.
Figure 8C:
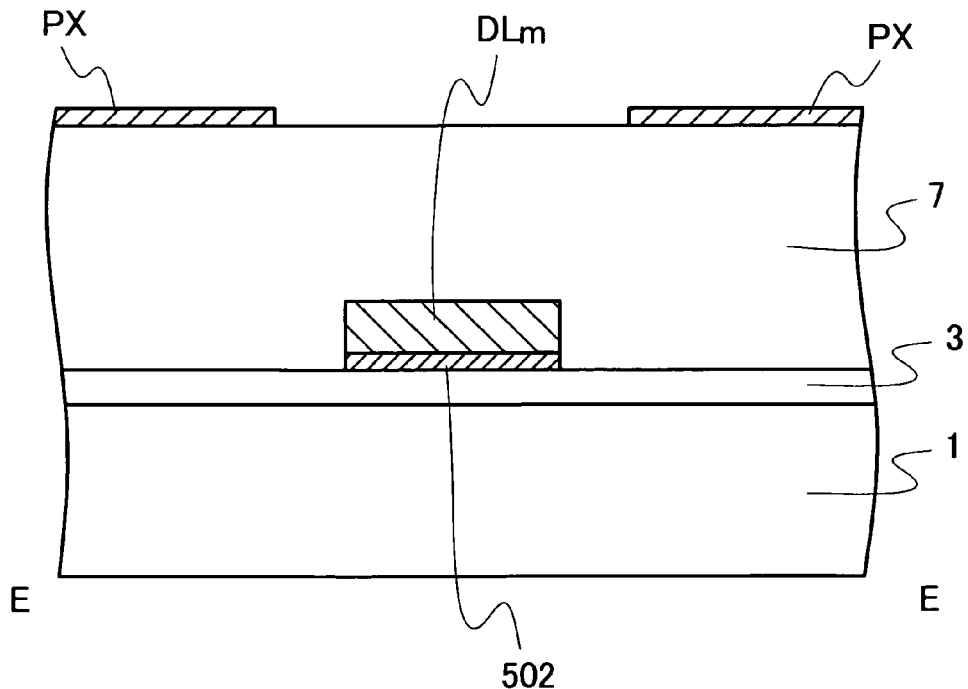
FIG. 8C is a cross-sectional view taken along the line E-E' of FIG. 8A.

FIG. 8A is a schematic plan view of one pixel in the display area in the TFT substrate. FIG. 8B is a cross-sectional view taken along the line D-D' of FIG. 8A. FIG. 8C is a cross-sectional view taken along the line E-E' of FIG. 8A.

For the structure of each pixel in the display area DA of the TFT substrate 8, various structures are available. Basically, each pixel includes a TFT element (switching element) and a pixel electrode connected to the source of the TFT element.

When the TFT element of each pixel in the TFT substrate 8 is of the bottom-gate type, the pixel may have a structure as shown in FIGS. 8A to 8C. The area of one pixel in the display area DA corresponds to a region surrounded by, for example, two adjacent scanning signal lines $GL_n$ and $GL_{n+1}$ and two adjacent video signal lines $DL_m$ and $DL_{m+1}$.

In this instance, the TFT element (switching element) includes the scanning signal line $GL_{n+1}$ stacked on the surface of the insulating substrate SUB made of, for example, glass, the first insulating layer 3, an active layer SC composed of semiconductor layer, the contact layer segments 501 and 502 composed of semiconductor layer, a source electrode SD1, and a drain electrode SD2. The scanning signal line $GL_{n+1}$ functions as the gate electrode of the TFT element. The first insulating layer 3 functions as a gate insulating film for the TFT element.

The drain electrode SD2 is connected to, for example, the video signal line $DL_m$ of the two adjacent video signal lines $DL_m$ and $DL_{m+1}$. In the typical TFT substrate 8, the drain electrode SD2 is integrated with the video signal line $DL_m$. The source electrode SD1 is connected via a through hole TH to a pixel electrode PX disposed with the second insulating layer 7 therebetween.

The active layer SC may be composed of polycrystalline semiconductor (e.g., polycrystalline silicon), which is the same material as that included in, for example, the TFT element in each first driver circuit GD. The active layer SC may be composed of amorphous semiconductor, such as amorphous silicon.

As described above, when the TFT elements (switching elements) in the display area DA and those of the first driver circuits GD and the second driver circuits DD are of the bottom-gate type, the TFT elements of the first driver circuits GD and the second driver circuits DD can be simultaneously formed in the step of forming the TFT elements in the display area DA.

When the active layer 4 in the TFT element of each of the first driver circuits GD and the second driver circuits DD is composed of polycrystalline silicon and the active layer SC in each TFT element in the display area DA is made of amorphous silicon, for example, the first insulating layer 3 may be covered with an amorphous silicon film and, after that, only the amorphous silicon film segments for formation of the first driver circuits GD and the second driver circuits DD may be polycrystallized. Advantageously, a reduction in manufacturing efficiency and an increase in manufacturing cost can be prevented.

FIGS. 8A to 8C illustrate an example of the structure of the pixel having the bottom-gate TFT element (switching element). The planar shape and position of the TFT element and the planar shape of the pixel electrode PX may be appropriately modified.

In the above description, the liquid crystal display panel (the TFT substrate 8) has been explained as an example of a semiconductor device having the TFT element according to the first embodiment. The first embodiment is not limited to this example. The first embodiment may be applied to a TFT element in a semiconductor device (semiconductor integrated circuit device) in chip form, such as a CPU, a DRAM, or a driver IC used in a related-art liquid crystal display device.

Figure 9:
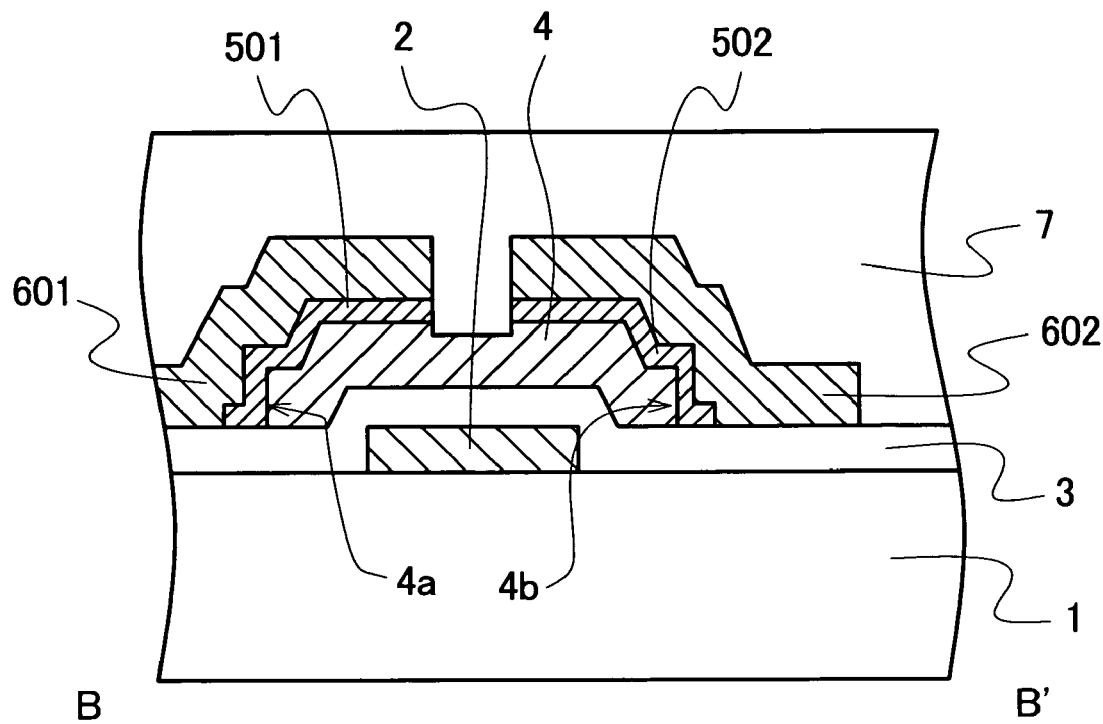
FIG. 9 is a schematic cross-sectional view of a TFT element according to an application of the first embodiment.
Figure 10:
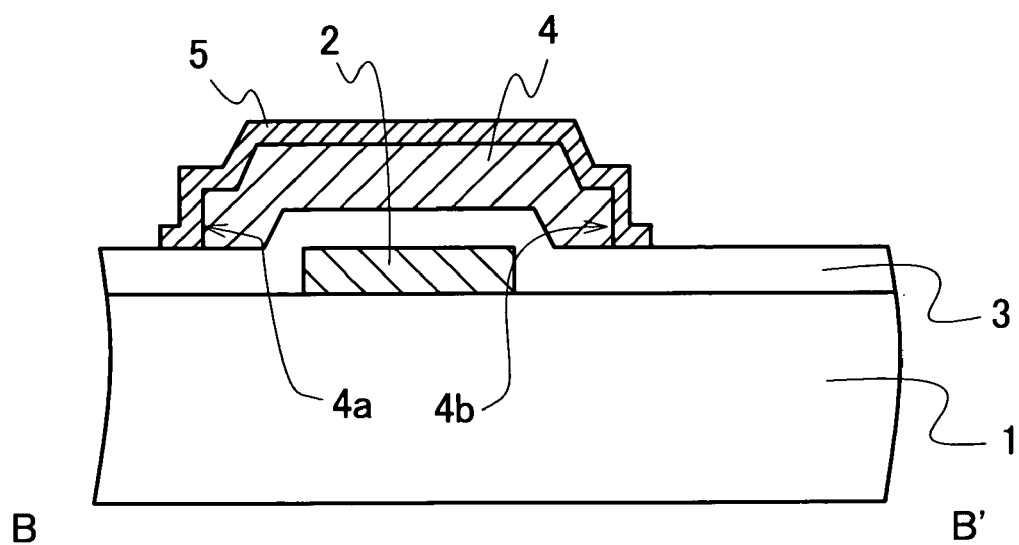
FIG. 10 is a schematic cross-sectional view for explaining a method of manufacturing the TFT element of FIG. 9.

FIG. 9 is a schematic cross-sectional view of a TFT element according to an application of the first embodiment. FIG. 10 is a schematic cross-sectional view for explaining a method of manufacturing the TFT element of FIG. 9. The cross-sectional views of FIGS. 9 and 10 correspond to that taken along the line B-B' of FIG. 4A.

In the TFT element according to the first embodiment, to prevent resistive leakage current from flowing through the TFT element when the TFT element is turned off, the contact layer segment 501 is interposed between the etched side face 4a of the active layer 4 and the source electrode 601 and the contact layer segment 502 is arranged between the etched side face 4b of the active layer 4 and the drain electrode 602. The method of manufacturing the TFT element with this structure has been described as an example with reference to FIGS. 2A to 2D.

In the TFT element according to the first embodiment, as described above, the contact layer segment 501 may be arranged between the etched side face 4a of the active layer 4 and the source electrode 601 and the contact layer segment 502 may be disposed between the etched side face 4b of the active layer 4 and the drain electrode 602. Accordingly, the TFT element according to the first embodiment may have a cross section in which the contact layer segments 501 and 502 are arranged only around the active layer 4 as shown in, for example, FIG. 9.

To form the TFT element having the cross section shown in FIG. 9, for example, the active layer 4 composed of polycrystalline silicon is formed in an island shape, as shown in FIG. 2A. Subsequently, the second semiconductor layer 5 for formation of the contact layer segments 501 and 502 is formed. The second semiconductor layer 5 is then etched, thus shaping the second semiconductor layer 5 into an island such that the second semiconductor layer 5 covers the active layer 4 (the etched side faces 4a and 4b), as shown in FIG. 10. After that, the conductive film 6 is formed and is then etched, thus forming the source electrode 601 and the drain electrode 602. The second semiconductor layer 5 is further etched, thereby forming the contact layer segments 501 and 502.

Second Embodiment

Figure 11:
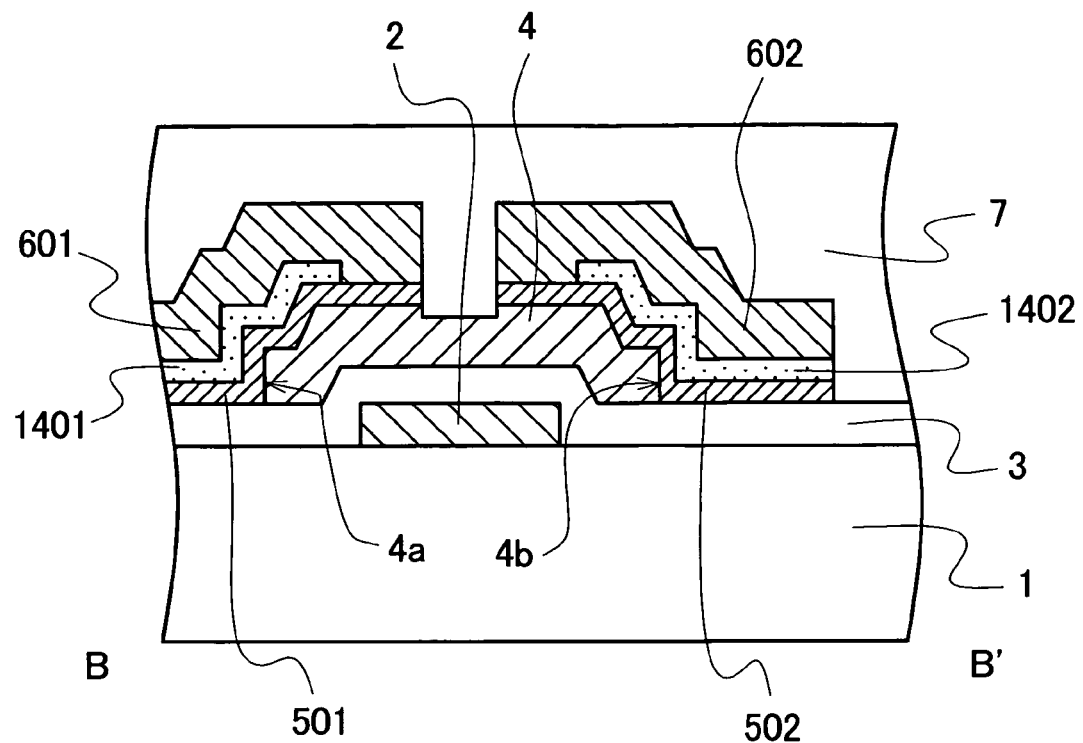
FIG. 11 is a schematic cross-sectional view of a TFT element according to a second embodiment of the invention.

FIG. 11 is a schematic cross-sectional view of a TFT element according to a second embodiment of the invention. The cross-sectional view of FIG. 11 corresponds to that taken along the line B-B' of FIG. 4A. Referring to FIG. 11, the TFT element further includes third insulating layer segments 1401 and 1402.

The second embodiment relates to the TFT element that has a structure based on the structure of the TFT element according to the first embodiment and that can further reduce resistive leakage current which flows through the TFT element when the TFT element is turned off.

As shown in FIG. 11, the TFT element according to the second embodiment has the same basic structure as that of the TFT element according to the first embodiment. In other words, the contact layer segment 501 is disposed between the etched side face 4a of the active layer 4 composed of polycrystalline silicon and the contact layer segment 502 is arranged between the etched side face 4b of the active layer 4 and the drain electrode 602.

In the TFT element according to the second embodiment, the third insulating layer segment 1401 is disposed between the etched side face 4a of the active layer 4 and the source electrode 601 in addition to the contact layer segment 501. In this case, the third insulating layer segment 1401 is interposed between the source electrode 601 and the contact layer segment 501 such that the third insulating layer segment 1401 is partially disposed between the first face of the source electrode 601 and the active layer 4. Similarly, the third insulating layer segment 1402 is arranged between the etched side face 4b of the active layer 4 and the drain electrode 602 in addition to the contact layer segment 502. In this case, the third insulating layer segment 1402 is disposed between the drain electrode 602 and the contact layer segment 502 such that the third insulating layer segment 1402 is partially disposed between the first face of the drain electrode 602 and the active layer 4.

With the above-described arrangement, the effect of insulation between the etched side face 4a of the active layer 4 and the source electrode 601 and that between the etched side face 4b of the active layer 4 and the drain electrode 602 when the TFT element is turned off is higher than that in the TFT element according to the first embodiment. Advantageously, the effect of preventing resistive leakage current which flows through the TFT element when the TFT element is turned off can be enhanced.

Figure 12A:
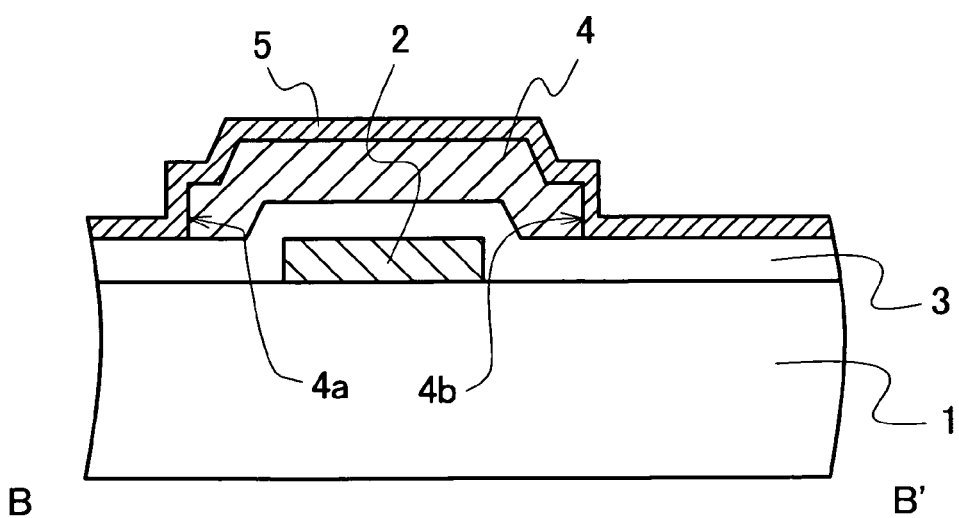
FIG. 12A is a schematic cross-sectional view illustrating a state just after a second semiconductor layer is formed.
Figure 12B:
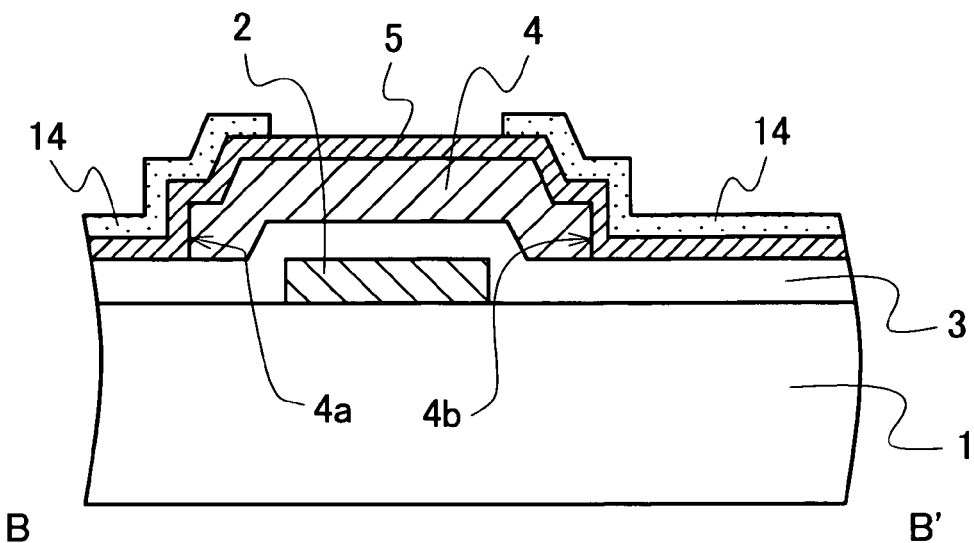
FIG. 12B is a schematic cross-sectional view just after a third insulating layer is formed.
Figure 12C:
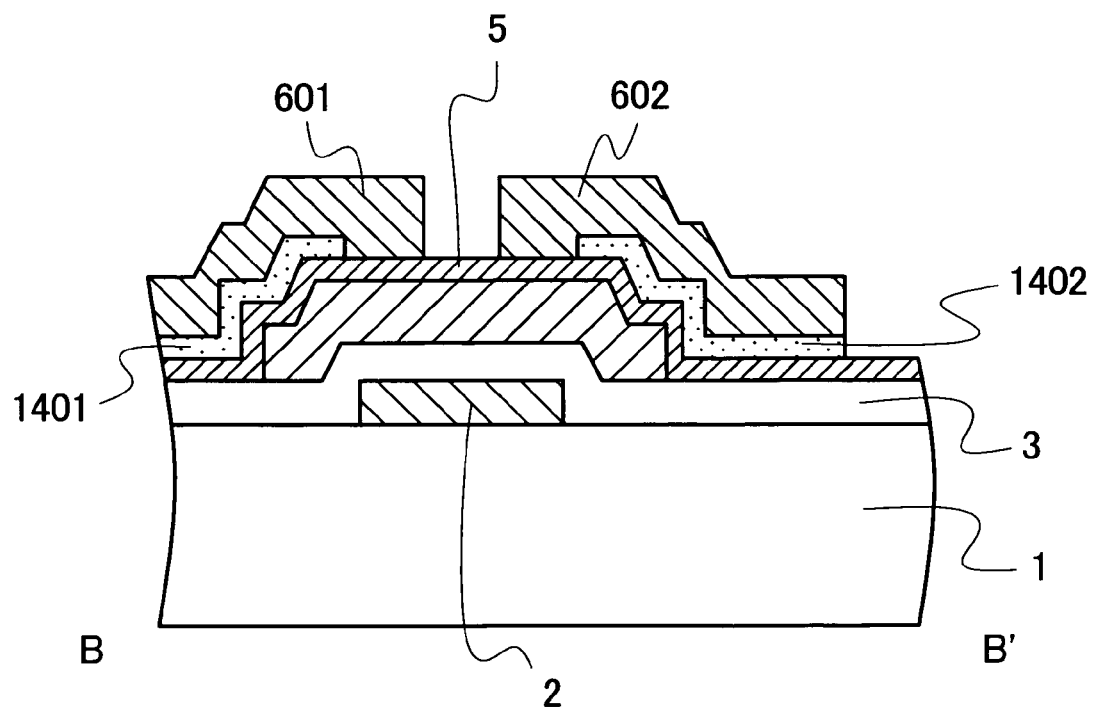
FIG. 12C is a schematic cross-sectional view illustrating a state just after a source electrode and a drain electrode are formed.
Figure 12D:
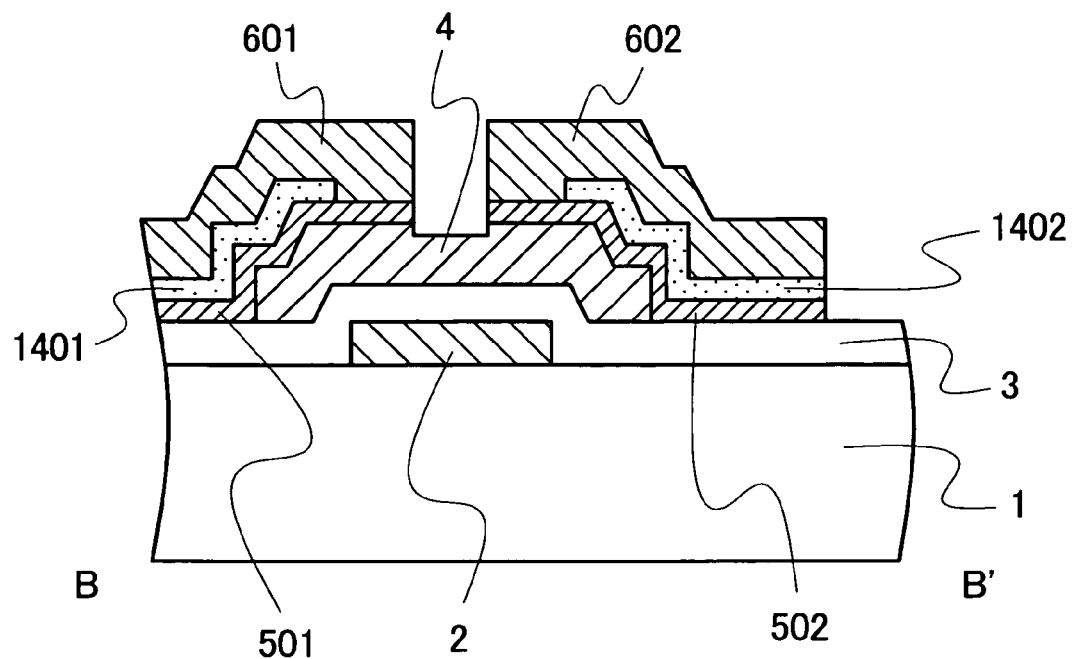
FIG. 12D is a schematic cross-sectional view illustrating a state just after the second semiconductor layer is etched.

FIGS. 12A to 12D are schematic cross-sectional views for explaining a method of manufacturing the TFT element according to the second embodiment. FIG. 12A is a schematic cross-sectional view illustrating a state just after the second semiconductor layer is formed. FIG. 12B is a schematic cross-sectional view showing a state just after the third insulating layer segments are formed. FIG. 12C is a schematic cross-sectional view showing a state just after the source electrode and the drain electrode are formed. FIG. 12D is a schematic cross-sectional view showing a state just after the second semiconductor layer is etched. The cross-sectional views of FIGS. 12A to 12D correspond to that taken along the line B-B' of FIG. 4A.

To form the TFT element according to the second embodiment, first, the gate electrode 2, the first insulating layer 3, and the island-shaped active layer 4 are formed on the first surface of the insulating substrate 1 according to, for example, the procedure described in the first embodiment.

Subsequently, the first insulating layer 3 having the active layer 4 thereon is overlaid with the second semiconductor layer 5, as shown in FIG. 12A. In this instance, the etched side faces 4a and 4b of the active layer 4 are covered with the second semiconductor layer 5.

The second semiconductor layer 5 is then covered with a third insulating layer 14, as shown in FIG. 12B. As for the third insulating layer 14, for example, a silicon oxide film is arranged over the second semiconductor layer 5 and the silicon oxide film is then etched, thus forming a window (opening) for providing connection between the source electrode 601 and the contact layer segment 501 and that between the drain electrode 602 and the contact layer segment 502 such that the window is located above the active layer 4.

Subsequently, the conductive film 6 is formed and is then etched, thereby forming the source electrode 601 and the drain electrode 602. After that, as shown in FIG. 12C, the third insulating layer 14 is etched so that the third insulating film 14 uncovered with the source electrode 601 and the drain electrode 602 is removed, thus forming the third insulating layer segments 1401 and 1402.

The second semiconductor film 5 is then etched as shown in FIG. 12D, thereby forming the contact layer segments 501 and 502. After that, the second insulating layer 7 is formed, thus obtaining the TFT element having the cross section as shown in FIG. 11.

In the TFT element according to the second embodiment, to form the conductive film 6 for formation of the source electrode 601 and the drain electrode 602, at least two kinds of conductive films having different compositions may be used.

Although concrete examples are not illustrate here, the structure of the TFT element according to the second embodiment may be applied to the TFT element in the TFT substrate 8 of the liquid crystal display panel described in the first embodiment and a TFT element of a semiconductor device in chip form, such as a CPU or a DRAM.

Figure 13A:
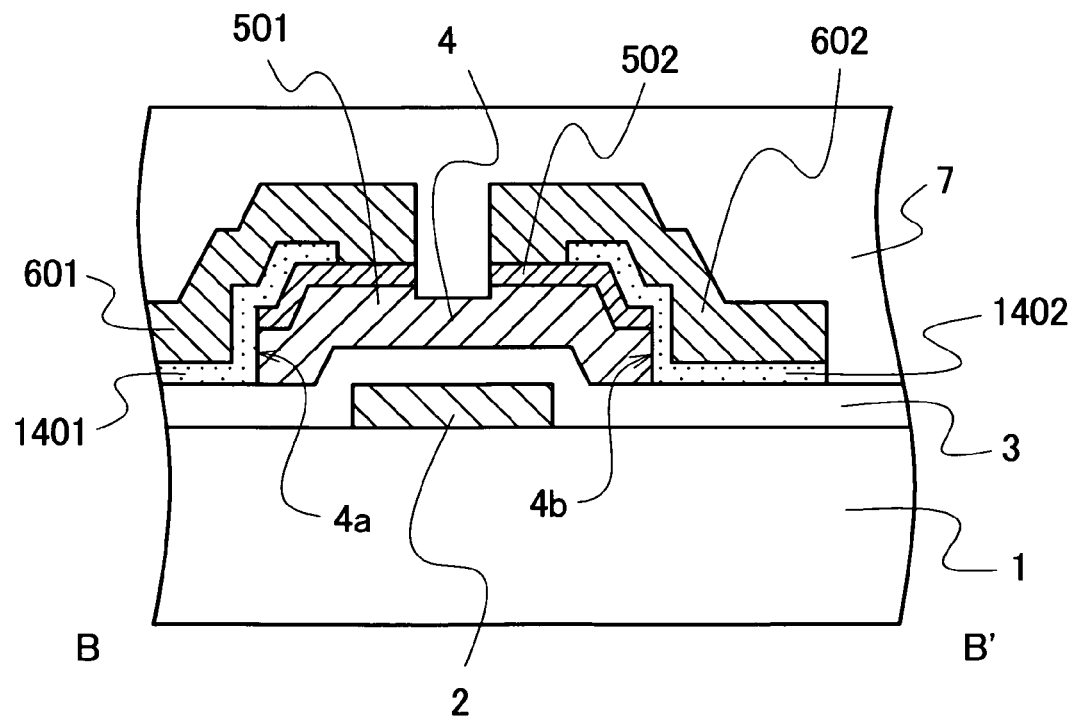
FIG. 13A is a schematic cross-sectional view of a TFT element according to a first modification of the second embodiment.
Figure 13B:
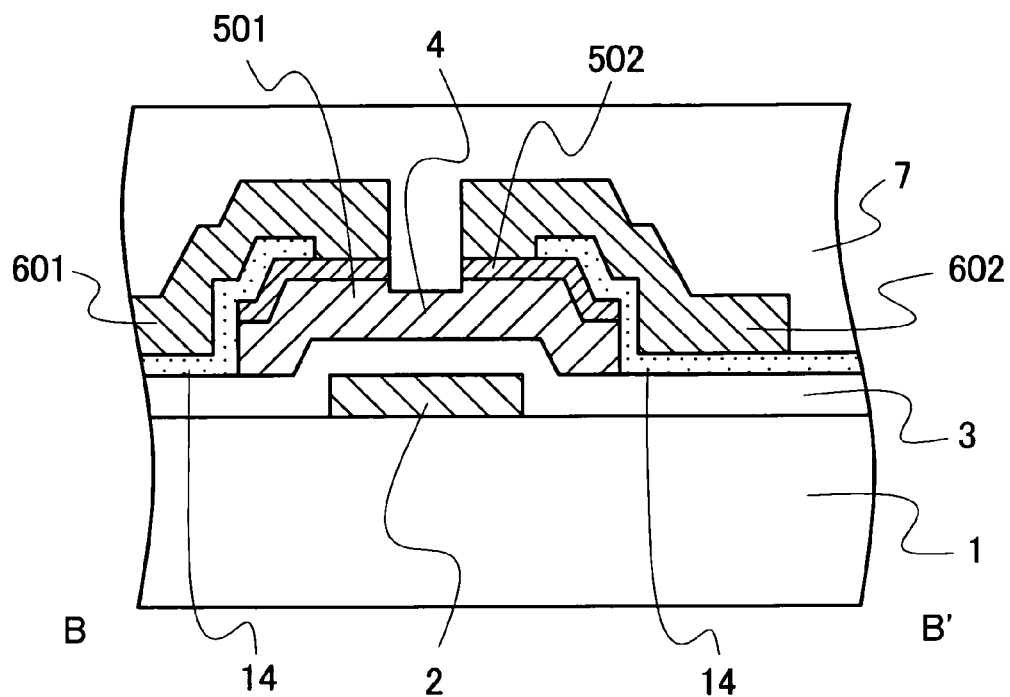
FIG. 13B is a schematic cross-sectional view of a TFT element according to a second modification of the second embodiment.
Figure 13C:
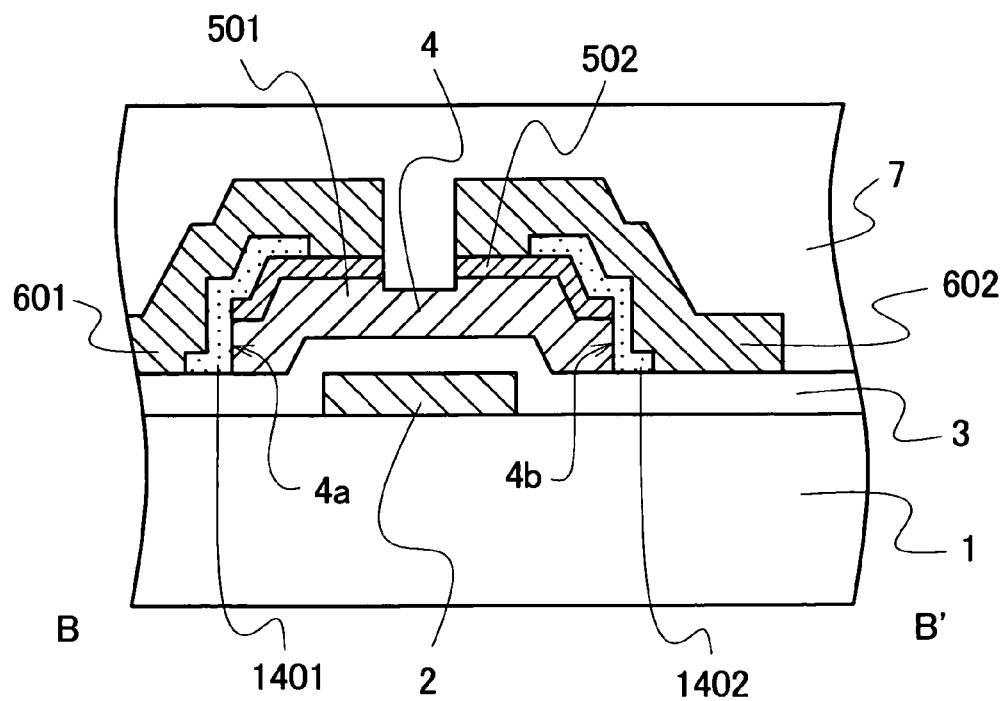
FIG. 13C is a schematic cross-sectional view of a TFT element according to a third modification of the second embodiment.

FIG. 13A is a schematic cross-sectional view of a TFT element according to a first modification of the second embodiment. FIG. 13B is a schematic cross-sectional view of a TFT element according to a second modification of the second embodiment. FIG. 13C is a schematic cross-sectional view of a TFT element according to a third modification of the second embodiment. The cross-sectional views of FIGS. 13A to 13C correspond to that taken along the line B-B' of FIG. 4A.

In the TFT element according to the second embodiment, the third insulating layer segment 1401 is disposed between the etched side face 4a of the active layer 4 and the source electrode 601, and the third insulating layer segment 1402 is arranged between the etched side face 4b of the active layer 4 and the drain electrode 602, thereby preventing resistive leakage current from flowing through the TFT element when the TFT element is turned off. In the TFT element according to the second embodiment, therefore, the contact layer segment 501 may be omitted between the etched side face 4a of the active layer 4 and the source electrode 601, and the contact layer segment 502 may be omitted between the etched side face 4b of the active layer 4 and the drain electrode 602, as shown in FIG. 13A.

To make the TFT element with the structure shown in FIG. 13A, for example, a polycrystalline semiconductor layer (first semiconductor layer) and the second semiconductor layer 5 are sequentially formed in a manner similar to the method of making the related-art TFT element. Subsequently, the active layer 4 is formed such that the active layer 4 has the second semiconductor layer 5 thereon and the etched side faces 4a and 4b are exposed. Next, the third insulating layer 14 is arranged in the same way as shown in FIG. 12C such that the third insulating layer 14 has a window (opening) for providing connection between the source electrode 601 and the contact layer segment 501 and that between the drain electrode 602 and the contact layer segment 502 and the window is located above the active layer 4. The source electrode 601 and the drain electrode 602 are then formed and the insulating film 14 is etched, thus forming the third insulating layer segments 1401 and 1402. After that, the second insulating layer 7 is formed, thus obtaining the TFT element having a cross section shown in FIG. 13A.

In the case where the TFT element is formed according to the above-described procedure, when the source electrode 601 and the drain electrode 602 are arranged, the contact layer segments 501 and 502 composed of amorphous silicon are disposed only on the active layer 4 as shown in, for example, FIG. 13B. Accordingly, so long as the third insulating layer 14 is composed of an insulating material having a high transmittance ratio, it is unnecessary to etch the third insulating layer 14 in order to form the third insulating layer segments 1401 and 1402 after the source electrode 601 and the drain electrode 602 are formed. In this case, the TFT element has a cross section as shown in FIG. 13B.

Furthermore, to form the TFT element according to the above-described procedure, the third insulating layer segment 1401 may be disposed between the etched side face 4a of the active layer 4 and the source electrode 601 and the third insulating layer segment 1402 may be arranged between the etched side face 4b of the active layer 4 and the drain electrode 602. Accordingly, to form the third insulating layer 14, the third insulating layer 14 may be formed in an island shape so as to cover the active layer 4 (and the second semiconductor layer 5). In this case, the TFT element has a cross section as shown in FIG. 13C.

Third Embodiment

Figure 14:
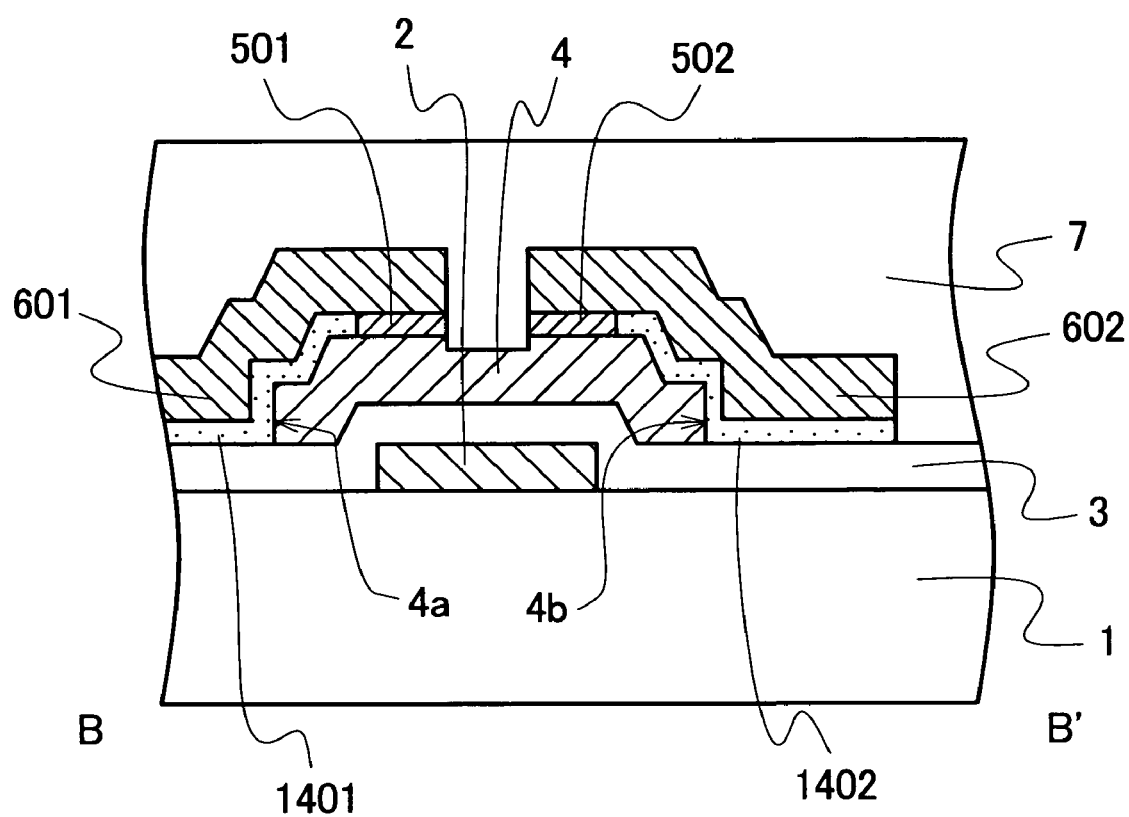
FIG. 14 is a schematic cross-sectional view of a TFT element according to a third embodiment of the invention.

FIG. 14 is a schematic cross-sectional view of a TFT element according to a third embodiment of the invention. The cross-sectional view of FIG. 14 corresponds to that taken along the line B-B' of FIG. 4A.

The third embodiment relates to an other structure of a TFT element that has a structure based on the structure of the TFT element according to the second embodiment and that can reduce resistive leakage current flowing through the TFT element when the TFT element is turned off.

The TFT element according to the third embodiment has the same basic structure as that of the TFT element described in the second embodiment as shown in, for example, FIG. 14. The third insulating layer segment 1401 is disposed between the etched side face 4a of the active layer 4 composed of polycrystalline silicon and the source electrode 601, and the third insulating layer segment 1402 is disposed between the etched side face 4b of the active layer 4 and the drain electrode 602.

The difference between the TFT element according to the third embodiment and that according to the second embodiment is the relationship between the contact layer segment 501 and the third insulating layer segment 1401 on the opposite face of the active layer 4 from the interface with the first insulating layer 3 (gate insulating film) and that between the contact layer segment 502 and the third insulating layer segment 1402 thereon. The contact layer segment 501 and the third insulating layer segment 1401 are disposed between the source electrode 601 and the active layer 4. The contact layer segment 502 and the third insulating layer segment 1402 are disposed between the drain electrode 602 and the active layer 4.

In the TFT element according to the third embodiment, only either the contact layer segment 501 or the third insulating layer segment 1401 is disposed between the first face of the source electrode 601 and the active layer 4. Similarly, only either the contact layer segment 502 or the third insulating layer segment 1402 is disposed between the first face of the drain electrode 602 and the active layer 4.

In the TFT element with the above-described arrangement, so long as the third insulating layer segment 1401 is disposed between the etched side face 4a of the active layer 4 and the source electrode 601 and the third insulating layer segment 1402 is arranged between the etched side face 4b of the active layer 4 and the drain electrode 602, resistive leakage current can be prevented from flowing through the TFT element when the TFT element is turned off.

Figure 15A:
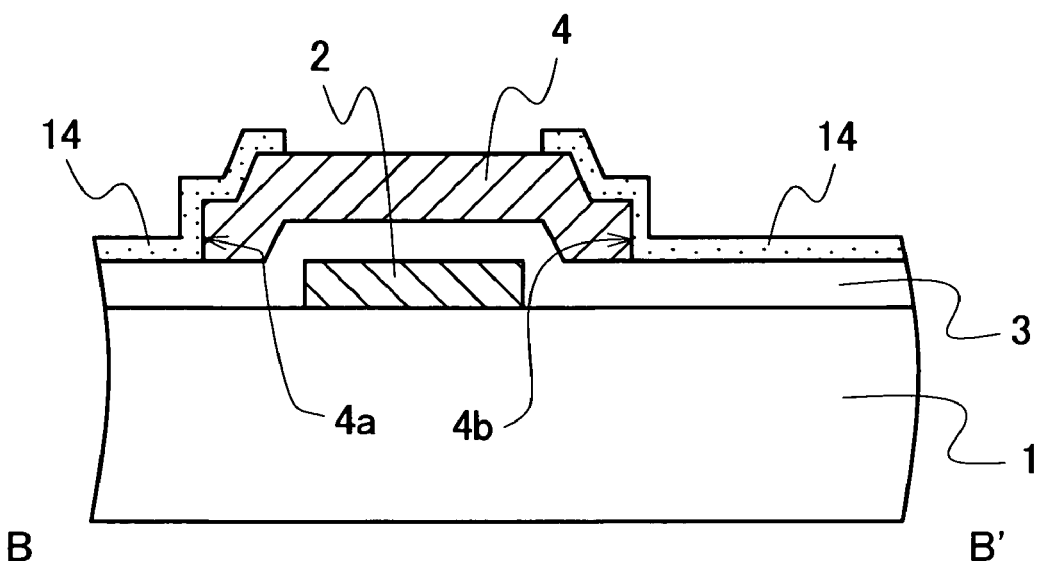
FIG. 15A is a schematic cross-sectional view illustrating a state just after a third insulating layer is formed.
Figure 15B:
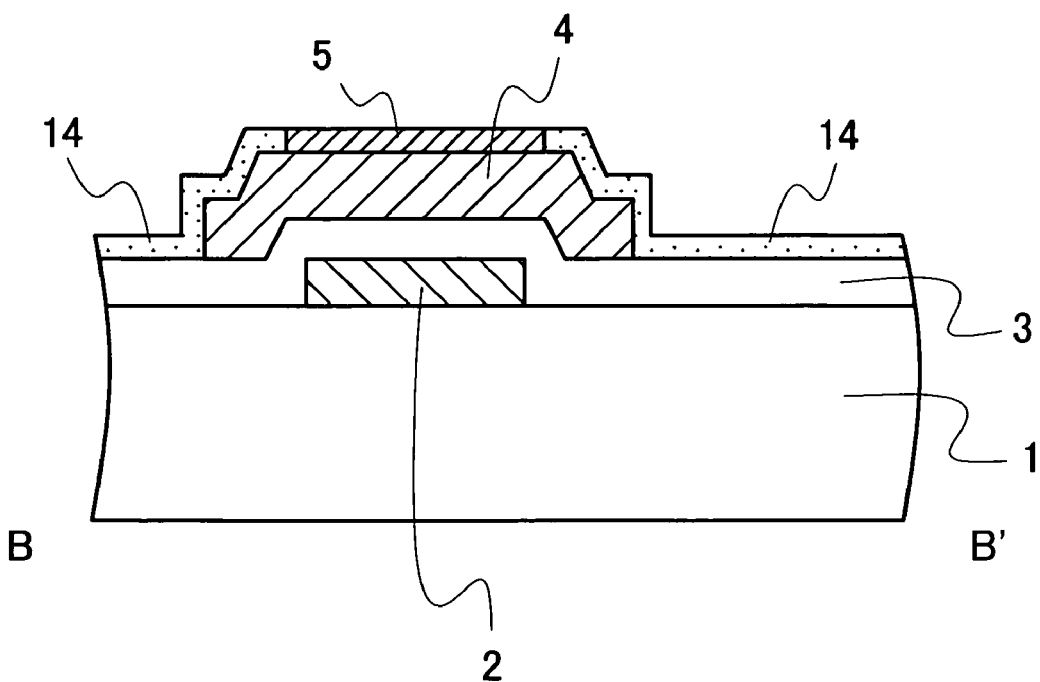
FIG. 15B is a schematic cross-sectional view illustrating a state just after a second semiconductor layer is formed.

FIGS. 15A and 15B are schematic cross-sectional views for explaining a method of manufacturing the TFT element according to the third embodiment. FIG. 15A is a schematic cross-sectional view illustrating a state just after the third insulating layer is formed. FIG. 15B is a schematic cross-sectional view illustrating a state just after the second semiconductor layer is formed. The cross-sectional views of FIGS. 15A and 15B correspond to that taken along the line B-B' of FIG. 4A.

To form the TFT element according to the third embodiment, first, the gate electrode 2, the first insulating layer 3, and the island-shaped active layer 4 are arranged on the first surface of the insulating substrate 1 in the same way as the first embodiment.

Subsequently, the third insulating layer 14 is formed on the first insulating layer 3 having the active layer 4 thereon, as shown in FIG. 15A. Specifically, the third insulating layer 14 is formed such that, for example, the second semiconductor layer 5 is covered with a silicon oxide film and the silicon oxide film is etched to form a window (opening) on the active layer 4 in order to provide connection between the source electrode 601 and the contact layer segment 501 and that between the drain electrode 602 and the contact layer segment 502.

The second semiconductor layer 5 is formed in the opening of the third insulating layer 14, for example, as shown in FIG. 15B.

After that, the source electrode 601 and the drain electrode 602 are formed, the third insulating layer 14 is etched to form the third insulating layer segments 1401 and 1402, and the second semiconductor layer 5 is etched to form the contact layer segments 501 and 502. Those steps are not illustrated here. Finally, the second insulating layer 7 is formed, thus obtaining the TFT element having the cross sectional structure as shown in FIG. 14.

In the TFT element according to the third embodiment, to form the conductive film 6 used for formation of the source electrode 601 and the drain electrode 602, at least two kinds of conductive films having different compositions may be used.

Although concrete examples are not illustrated here, the structure of the TFT element according to the third embodiment may be applied to the TFT element in the TFT substrate 8 of the liquid crystal display panel described in the first embodiment and a TFT element in a semiconductor device in chip form, such as a CPU or a DRAM.

Figure 16A:
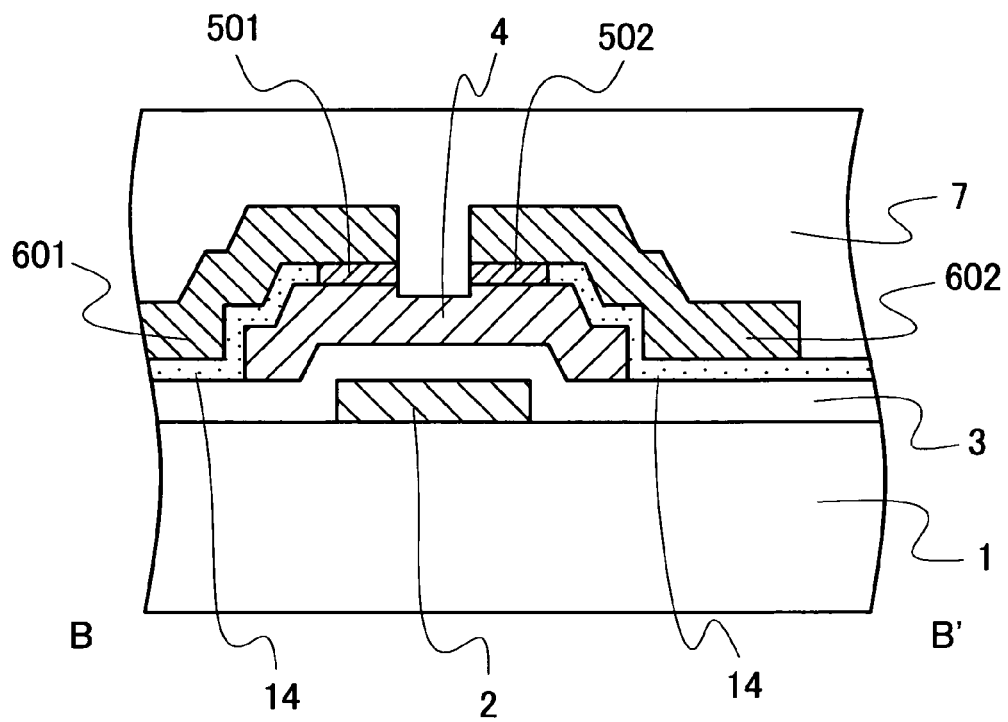
FIG. 16A is a schematic cross-sectional view of a TFT element according to a first modification of the third embodiment.
Figure 16B:
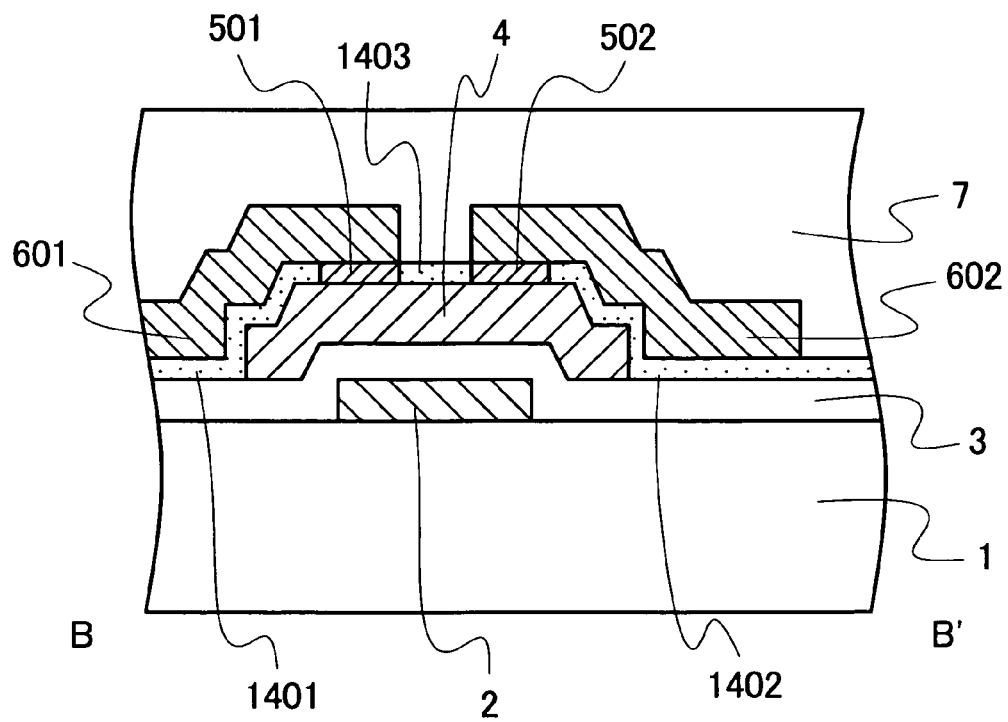
FIG. 16B is a schematic cross-sectional view of a TFT element according to a second modification of the third embodiment.

FIG. 16A is a schematic cross-sectional view of a TFT element according to a first modification of the third embodiment. FIG. 16B is a schematic cross-sectional view of a TFT element according to a second modification of the third embodiment. The cross-sectional views of FIGS. 16A and 16B correspond to that taken along the line B-B' of FIG. 4A.

In the case where the TFT element is formed according to the above-described procedure, when the source electrode 601 and the drain electrode 602 are formed, the second semiconductor layer 5 used for formation of the contact layer segments 501 and 502 is arranged only on the active layer 4. Accordingly, so long as the third insulating layer 14 is composed of an insulating material having a high transmittance ratio, it is unnecessary to etch the third insulating layer 14 in order to form the third insulating layer segments 1401 and 1402 after the source electrode 601 and the drain electrode 602 are formed. In this case, the TFT element has a cross sectional structure as shown in FIG. 16A.

According to the method of manufacturing the above-described TFT element, the third insulating layer 14 is formed so as to have one opening on the single active layer 4. The source electrode 601 and the drain electrode 602 are formed and, after that, the second semiconductor layer 5 is separated into the contact layer segments 501 and 502. The third insulating layer 14 may be formed so as to have an opening for formation of the contact layer segment 501 and another opening for formation of the contact layer segment 502 on the single active layer 4. The second semiconductor layer 5 may be formed in each opening. In this case, the TFT element has a cross sectional structure as shown in FIG. 16B.

In the case where the TFT element is formed in this manner, after the source electrode 601 and the drain electrode 602 are formed, the step of etching the second semiconductor layer 5 to form the contact layer segments 501 and 501 may be omitted.

Furthermore, in the TFT element according to the third embodiment, the third insulating layer segments 1401 and 1402 may be disposed only around the active layer 4, as shown in FIG. 13C. The structure is not illustrated here.

While the present invention has been described on the basis of the preferred embodiments, it should be understood that the invention is not limited to those precise embodiments and various changes and modifications thereof could be made without departing from the spirit and scope of the invention.

What is claimed is:

1. A display device comprising:
an insulating substrate having a first surface; and
a TFT element arranged on the first surface of the insulating substrate,
wherein the TFT element includes a gate electrode, a gate insulating film, a semiconductor layer, and a source electrode and a drain electrode arranged in that order on the first surface of the insulating substrate,
wherein the semiconductor layer includes:
an island-shaped active layer composed of polycrystalline semiconductor;
a contact layer formed above the active layer; and
an insulating layer formed above the contact layer and sandwiched between the active layer and the source electrode or the drain electrode,
wherein the insulating layer has an opening for electrically connecting the contact layer and the drain electrode or the source electrode,
wherein the insulating layer and the contact layer each have a segment interposed between the active layer and the source electrode and another segment interposed between the active layer and the drain electrode, and
wherein each contact layer segment is arranged on a side face of the active layer.

2. The display device according to claim 1, wherein the insulating layer is different from the gate insulating film and made of a silicon oxide film.

3. A display device comprising:
an insulating substrate having a first surface; and
a TFT element arranged on the first surface of the insulating substrate,
wherein the TFT element includes a gate electrode, a gate insulating film, a semiconductor layer, and a source electrode and a drain electrode arranged in that order on the first surface of the insulating substrate,
wherein the semiconductor layer includes:
an island-shaped active layer composed of polycrystalline semiconductor;
a contact layer formed above the active layer; and
an insulating layer formed above the contact layer and sandwiched between the active layer and the source electrode or the drain electrode,
wherein the insulating layer has an opening for electrically connecting the contact layer and the drain electrode or the source electrode, and
wherein the contact layer has a segment between the active layer and the source electrode and another segment between the active layer and the drain electrode, each contact layer segment is disposed on a side face of the active layer, and the insulating layer is disposed between the active layer and each of the source electrode and the drain electrode.

4. The display device according to claim 3, wherein the contact layer segments, the source electrode, and the drain electrode have substantially the same projected shape on the first surface of the insulating substrate.

5. The display device according to claim 3, wherein each of the source electrode and the drain electrode is a laminate including at least two kinds of conductive films having different compositions.

6. The display device according to claim 3, wherein the insulating substrate has a plurality of pixel electrodes arranged in a matrix and a display area where pixels each including the pixel electrode are arranged.

7. The display device according to claim 3, wherein the TFT element functions as a switching element.

8. The display device according to claim 3, wherein the insulating substrate has a plurality of pixel electrodes arranged in a matrix, a display area where pixels each including the pixel electrode are arranged, and a driver circuit including the TFT element, the driver circuit being disposed outside the display area.

9. The display device according to claim 3, wherein the insulating substrate has a plurality of switching elements arranged in a matrix and each switching element includes an active layer composed of amorphous semiconductor.

* * * * *